(12) United States Patent
Takeuchi et al.

(10) Patent No.: US 11,125,628 B2
(45) Date of Patent: Sep. 21, 2021

(54) SEMICONDUCTOR DEVICE AND SEMICONDUCTOR SYSTEM

(71) Applicant: RENESAS ELECTRONICS CORPORATION, Tokyo (JP)

(72) Inventors: Kan Takeuchi, Tokyo (JP); Shinya Konishi, Tokyo (JP); Fumio Tsuchiya, Tokyo (JP); Masaki Shimada, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 336 days.

(21) Appl. No.: 16/126,816

(22) Filed: Sep. 10, 2018

(65) Prior Publication Data

US 2019/0154518 A1    May 23, 2019

(30) Foreign Application Priority Data

Nov. 22, 2017    (JP) .............................. JP2017-224143

(51) Int. Cl.
*G01K 7/01*    (2006.01)
*G01R 31/30*    (2006.01)
*G01K 15/00*    (2006.01)

(52) U.S. Cl.
CPC ........... *G01K 7/01* (2013.01); *G01R 31/3004* (2013.01); *G01K 15/005* (2013.01)

(58) Field of Classification Search
CPC ...... G01K 7/01; G01K 13/00; G01K 2217/00; G01K 7/00; G01N 2021/745; G01N 2033/0095
USPC ......... 374/163, 183, 170, 178, 1, 45, 46, 57; 327/512, 513
See application file for complete search history.

(56) References Cited

U.S. PATENT DOCUMENTS

| | | | |
|---|---|---|---|
| 5,440,305 A * | 8/1995 | Signore | G01K 7/01 341/120 |
| 6,283,628 B1 | 9/2001 | Goodwin | |
| 6,823,293 B2 | 11/2004 | Chen et al. | |
| 6,890,097 B2 * | 5/2005 | Tanaka | G01K 7/01 374/163 |
| 7,399,116 B2 | 7/2008 | Takeuchi | |

(Continued)

FOREIGN PATENT DOCUMENTS

| | | |
|---|---|---|
| JP | 2004-212387 A | 7/2004 |
| JP | 2005-345426 A | 12/2005 |

(Continued)

OTHER PUBLICATIONS

Japanese Notice of Reasons for Refusal issued in corresponding Japanese Patent Application No. 2017-224143, dated Jan. 26, 2021, with English translation.

*Primary Examiner* — Gail Kaplan Verbitsky
(74) *Attorney, Agent, or Firm* — McDermott Will & Emery LLP

(57) ABSTRACT

An object of the present invention is to provide a technique of duplexing monitor circuits in which a common cause failure can be eliminated. A semiconductor device has: a first monitor circuit monitoring that temperature or voltage of the semiconductor device is within a normal operation range; and a second monitor circuit monitoring normal operation of the first monitor circuit. The first and second monitor circuits generate information of temperature or voltage on the basis of different principles.

9 Claims, 17 Drawing Sheets

(56) References Cited

U.S. PATENT DOCUMENTS

| | | | |
|---|---|---|---|
| 7,399,136 B2* | 7/2008 | Petrie | B29C 45/14336 281/29 |
| 8,049,527 B2 | 11/2011 | Lee | |
| 8,444,316 B2 | 5/2013 | Saneyoshi et al. | |
| 8,475,039 B2* | 7/2013 | Chern | G01K 7/01 374/170 |
| 9,004,754 B2* | 4/2015 | Swei | G01K 7/01 374/170 |
| 9,086,330 B2* | 7/2015 | Chern | G01K 7/01 |
| 9,607,906 B2* | 3/2017 | Pontarollo | H01L 22/14 |
| 9,816,872 B2* | 11/2017 | Zhang | G01K 13/00 |
| 10,386,243 B2* | 8/2019 | Abughazaleh | G06F 11/3058 |
| 2003/0086476 A1* | 5/2003 | Mizuta | G01K 15/00 374/178 |
| 2006/0138582 A1* | 6/2006 | Han | G01K 7/226 257/467 |
| 2006/0138633 A1* | 6/2006 | Naruse | H01L 24/72 257/688 |
| 2012/0206107 A1* | 8/2012 | Ono | H02J 7/0029 320/136 |
| 2013/0083825 A1* | 4/2013 | Zhang | G01K 7/01 374/178 |
| 2013/0120930 A1* | 5/2013 | Temkine | G01K 7/01 361/679.47 |
| 2014/0341258 A1* | 11/2014 | Chang | G01K 7/01 374/178 |
| 2016/0299013 A1* | 10/2016 | Selgi | G01K 7/015 |
| 2017/0023630 A1 | 1/2017 | Zettler et al. | |
| 2017/0187358 A1 | 6/2017 | Takeuchi et al. | |
| 2019/0246317 A1* | 8/2019 | Liu | H04W 28/24 |
| 2019/0346317 A1* | 11/2019 | Ikeda | G01K 7/01 |
| 2019/0383670 A1* | 12/2019 | Sathik | G01K 7/015 |
| 2020/0064206 A1* | 2/2020 | Hamano | G01K 7/01 |

FOREIGN PATENT DOCUMENTS

| | | |
|---|---|---|
| JP | 2008-227192 A | 9/2008 |
| JP | 2011-089950 A | 5/2011 |
| JP | 2012-222192 A | 11/2012 |
| JP | 2013-500602 A | 1/2013 |
| JP | 2014-048046 A | 3/2014 |
| JP | 2017-118414 A | 6/2017 |
| WO | 2009/084352 A1 | 7/2009 |

* cited by examiner

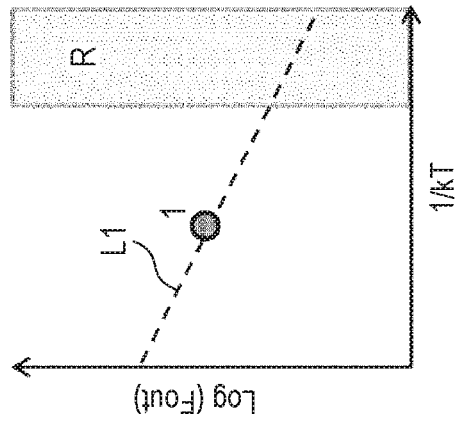
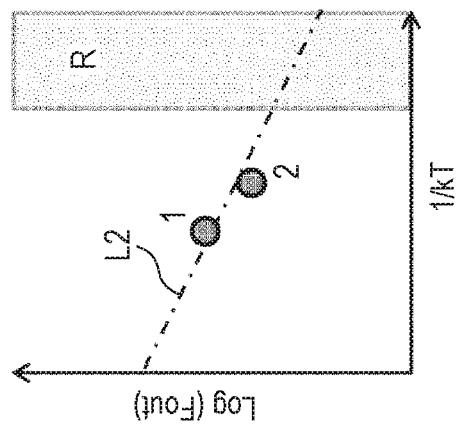
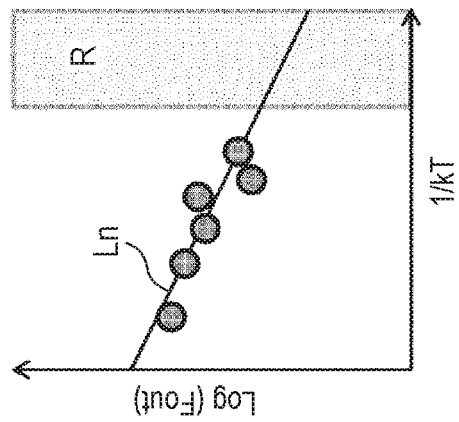

SEMICONDUCTOR DEVICE AND SEMICONDUCTOR SYSTEM

CROSS-REFERENCE TO RELATED APPLICATIONS

The disclosure of Japanese Patent Application No. 2017-224143 filed on Nov. 22, 2017 including the specification, drawings and abstract is incorporated herein by reference in its entirety.

BACKGROUND

The present disclosure relates to a semiconductor device and can be applied to a high-reliable semiconductor integrated circuit device and a semiconductor system using the same.

A semiconductor device for a vehicle and industry is required to have high functionality and high reliability. Due to a strong demand for the high functionality of a semiconductor device, a concern for a damage of the semiconductor device itself and a system mounting the semiconductor device caused by heat generation of the semiconductor device is increasing. For example, in a DVFS (Dynamic Voltage Frequency Scaling) realizing high functionality in short time by temporarily increasing voltage, it is necessary to pay attention to destruction of a gate insulating film of a semiconductor element by high voltage. It is also necessary to handle a concern of increase in temperature or voltage of a semiconductor device accompanying higher functionality and decrease of the reliability of the semiconductor device as a result of the increase.

There is a high-reliable semiconductor device having a monitor circuit for monitoring temperature or voltage of the device itself. As a temperature monitor circuit and a voltage monitor circuit, Japanese Unexamined Patent Application Publication No. 2005-345426 (patent literature 1), Japanese Unexamined Patent Application Publication No. 2004-212387 (patent literature 2), WO publication 2009/84352 (patent literature 3), Japanese Unexamined Patent Application Publication No. 2011-89950 (patent literature 4), Japanese Translation of PCT International Application Publication No. 2013-500602 (patent literature 5) and the like are proposed.

SUMMARY

However, in a high-reliable semiconductor device, safety of the function of a monitor circuit for monitoring temperature or voltage of the device has to be also considered. Specifically, it is necessary to assure that a monitor circuit of monitoring temperature or voltage functions correctly.

The inventors of the present disclosure examined to mount a first monitor circuit monitoring the temperature or voltage of a semiconductor device and a second monitor circuit of temperature or voltage for monitoring the safety of function of the first monitor circuit in the semiconductor device. For example, in the case of simply duplicating the same monitor circuit of temperature or voltage as first and second monitor circuits, the inventors noticed that there are the following problems.

(1) When the duplicate monitor circuits have a function failure which is overlooked at the time of designing and at the time of shipment, even the monitor circuits are duplicated, there is the possibility that monitoring incompleteness caused by the failure cannot be prevented. That is, even the same monitor circuits are simply duplicated, a common cause failure is inherent.

(2) Due to increase in the area of duplicated monitor circuits occupying a semiconductor chip and increase in the load of a test of duplicated monitor circuits before shipment, there is the possibility that the cost of the semiconductor device increases.

An object of the present disclosure is to provide a technique of duplicating monitor circuits in which a common cause failure can be eliminated.

The other problems and novel features will become apparent from the description of the specification and appended drawings.

Outline of representative one of the disclosure will be briefly described as follows.

A semiconductor device has: a first monitor circuit monitoring that temperature or voltage of the semiconductor device is within a normal operation range; and a second monitor circuit monitoring normal operation of the first monitor circuit. The first and second monitor circuits generate information of temperature or voltage on the basis of different principles.

By the semiconductor device, the technique of duplicating monitor circuits in which a common cause failure can be eliminated can be provided.

BRIEF DESCRIPTION OF THE DRAWINGS

FIGS. 16A to 16C are diagrams explaining correction information in the case where the first and second monitor circuits are temperature monitor circuits.

DETAILED DESCRIPTION

Figure 1:
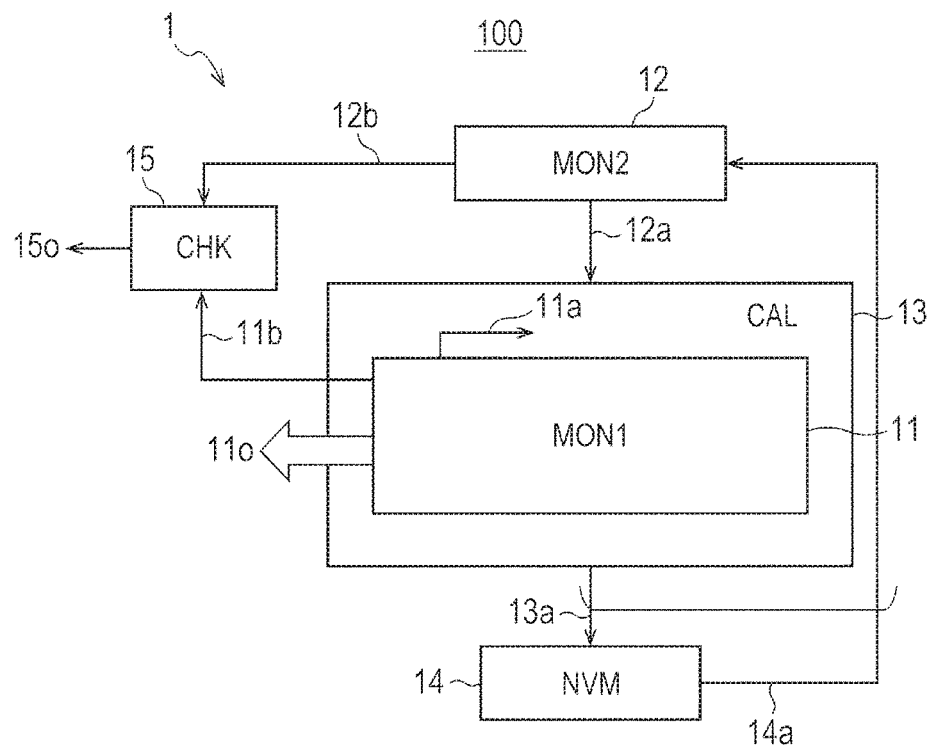
FIG. 1 is a diagram illustrating a configuration example of a monitor unit according to an embodiment.

Hereinbelow, embodiments and modifications will be described with reference to the drawings. In the following description, the same reference numeral is assigned to the same components and repetitive description will not be given as necessary. There are cases that widths, thickness, shapes, and the like of components are schematically illustrated as compared with actual modes in order to clarify the description. However, those are an example and do not limit interpretation of the present invention.

Embodiment

FIG. 1 is a diagram for explaining a configuration example of a monitor unit according to an embodiment. A monitor unit 1 is configured as an on-chip monitor built in a semiconductor device 100. The monitor unit 1 has a first monitor circuit (MON1) 11, a second monitor circuit (MON2) 12, an on-chip correction circuit (CAL) 13, a nonvolatile memory (NVM) 14, and an on-chip check circuit (CHK) 15.

The first monitor circuit 11 is an on-chip monitor circuit monitoring that the temperature or voltage of the semiconductor chip of the semiconductor device 100 is within a normal operation range. An output signal (first information) 1 of the first monitor circuit 11 is an output value (first information) indicating a monitor result. The second monitor circuit 12 is an on-chip monitor circuit provided to monitor whether the operation of the first monitor circuit 11 is normal or abnormal.

The on-chip correction circuit 13 generates correction information or calibration information 13a for correcting/calibrating the absolute value of temperature or voltage of an output value 12b (third information) of the second monitor circuit 12 on the basis of an output value (second information) 12a of the second monitor circuit 12 and an output value 11a (first information) of the first monitor circuit 11. The calibration information 13a generated by the on-chip correction circuit 13 is stored in the nonvolatile memory (NVM) 14. The calibration information 13a stored in the nonvolatile memory (NVM) 14 is transmitted as calibration information 14a to the second monitor circuit 12 and used for correction or calibration of the absolute value of temperature or voltage of the output value 12a of the second monitor circuit 12.

The on-chip check circuit (CHK) 15 is provided to receive an output value 11b(first information) of the first monitor circuit 11 and the output value 12b (third information) of the second monitor circuit 12 and check whether the output value 11b (first information) of the first monitor circuit 11 is normal or not on the basis of the output value 12b (third information) of the second monitor circuit 12. The on-chip check circuit (CHK) 15 assures the normal operation of the first monitor circuit 11. When it is determined that the first monitor circuit 11 performs the normal operation, an output signal 15o of the on-chip check circuit (CHK) 15 is set to a value expressing that the first monitor circuit 11 performs the normal operation, for example, the low level or high level. On the other hand, when it is determined that the first monitor circuit 11 and/or the second monitor circuit 12 perform/performs abnormal operation, the output value 15o is set to a value expressing that the first monitor circuit 11 or the second monitor circuit 12 is abnormal, for example, the high level or low level.

Preferably, the first and second monitor circuits 11 and 12 generate information of temperature or voltage by different principles. By the operation, the inherence of a common cause failure by simple duplication of the same monitor circuits can be prevented. For example, in the case where the first monitor circuit 11 is a temperature monitor or a temperature sensor using a band gap circuit, the second monitor circuit 12 can be set to a temperature monitor or a temperature sensor using leak current. For example, in the case where the first monitor circuit 11 is a voltage monitor or a voltage sensor using an analog-to-digital conversion circuit, the second monitor circuit 12 can be set to a voltage monitor or a voltage sensor using a ring oscillator having voltage dependency.

The generation of the calibration information 13a by the on-chip correction circuit 13 is executed, preferably, after the semiconductor device 100 is shipped and mounted in a semiconductor system. The calibration information 13a obtained at this time can be stored in the nonvolatile memory (NVM) 14 mounted in the semiconductor system after shipment of the semiconductor device 100. The nonvolatile memory (NVM) 14 can be regarded as a nonvolatile storage circuit of an off chip which is not provided on the inside of the semiconductor device 100. The nonvolatile memory (NVM) 14 can be set as an on-chip nonvolatile storage circuit such as a flash memory which is provided on the inside of the semiconductor device 100.

Figure 2:
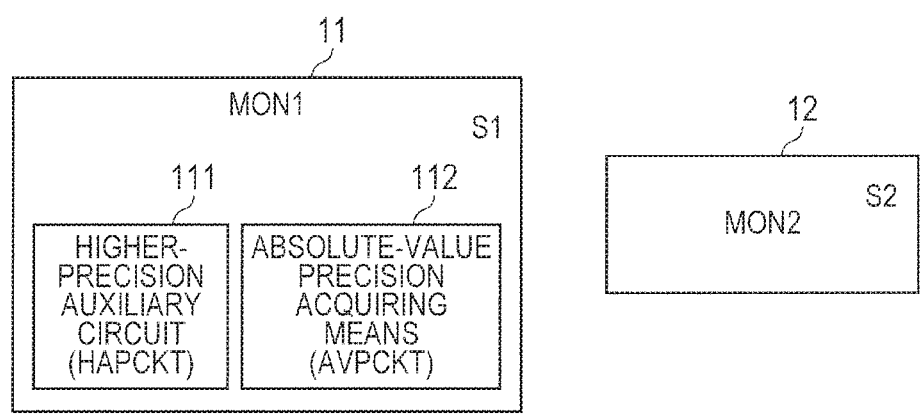
FIG. 2 is a diagram illustrating a first monitor circuit and a second monitor circuit according to the embodiment.

FIG. 2 is a diagram illustrating the first monitor circuit 11 and the second monitor circuit 12 according to the embodiment. The first monitor circuit 11 is adjusted at the time of designing of the semiconductor device 100 and at the time of a pre-shipment test of the semiconductor device 100 so that temperature or voltage can be monitored at high precision. Specifically, the first monitor circuit 11 includes a higher-precision auxiliary circuit 111 and an absolute-value precision acquiring means 112. With the configuration, the first monitor circuit 11 can monitor the temperature or voltage of the semiconductor device 100 at high precision.

On the other hand, the second monitor circuit 12 is configured so as to output the absolute value of temperature or voltage on the basis of the calibration information 13a obtained by the semiconductor device 100 after shipment of the semiconductor device 100. Consequently, the second monitor circuit 12 does not have to have extra circuits to increase the precision of the absolute value such as the higher-precision auxiliary circuit 111 and the absolute-value precision acquiring means 112 provided for the first monitor circuit 11. Therefore, the area S2 occupying in the semiconductor chip of the second monitor circuit 12 can be made smaller than the area S1 occupying in the semiconductor chip of the first monitor circuit 11. For the second monitor circuit 12, a pre-shipment test related to calibration of the absolute value of the temperature or voltage can be omitted.

It produces an effect that the second monitor circuit monitoring the normal operation of the first monitor circuit can be realized at low cost.

Figure 3:
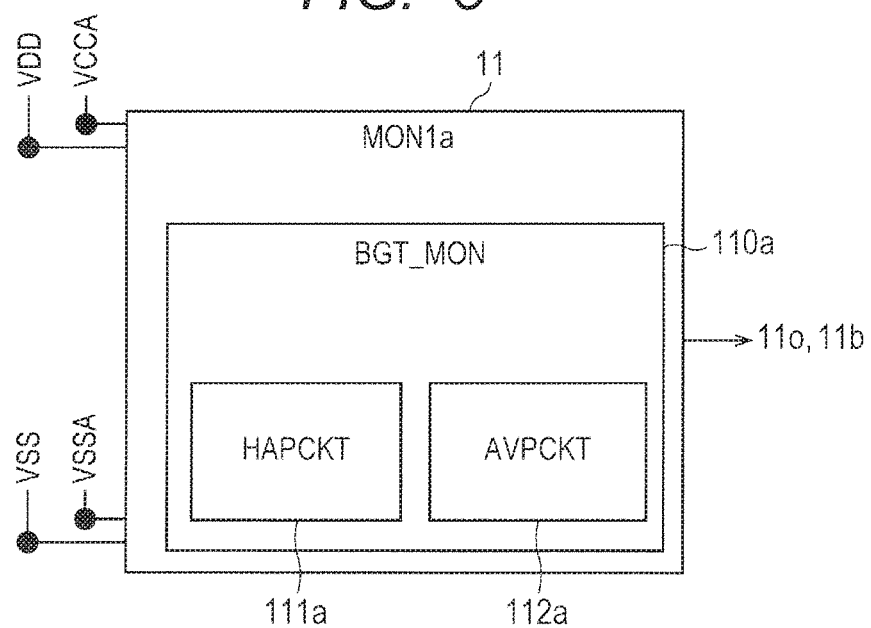
FIG. 3 is a diagram illustrating a configuration example of the first monitor circuit as a temperature monitor.

FIG. 3 is a diagram illustrating a configuration example of the first monitor circuit as a temperature monitor. The first monitor circuit (MON1a) 11 has a bandgap temperature monitor (BGPT_MON) 110a, and the bandgap temperature monitor (BGPT_MON) 110a has a higher-precision auxiliary circuit (HPACKT) 111a and an absolute-value precision acquiring circuit (AVPCKT) 112a. The first monitor circuit (MON1a) 11 is coupled to reference potential VDD as a first power supply voltage for a digital circuit and a reference potential VDDA as a second power supply voltage potential for an analog circuit. The first monitor circuit (MON1a) 11 is coupled to a reference potential VSS as the first ground voltage for a digital circuit, and a reference potential VSSA as a second ground voltage for an analog circuit. With such a configuration, the first monitor circuit (MON1a) 11 can output, for example, high-precision temperature information as output signals (11o and 11b) of digital values.

Figure 4:
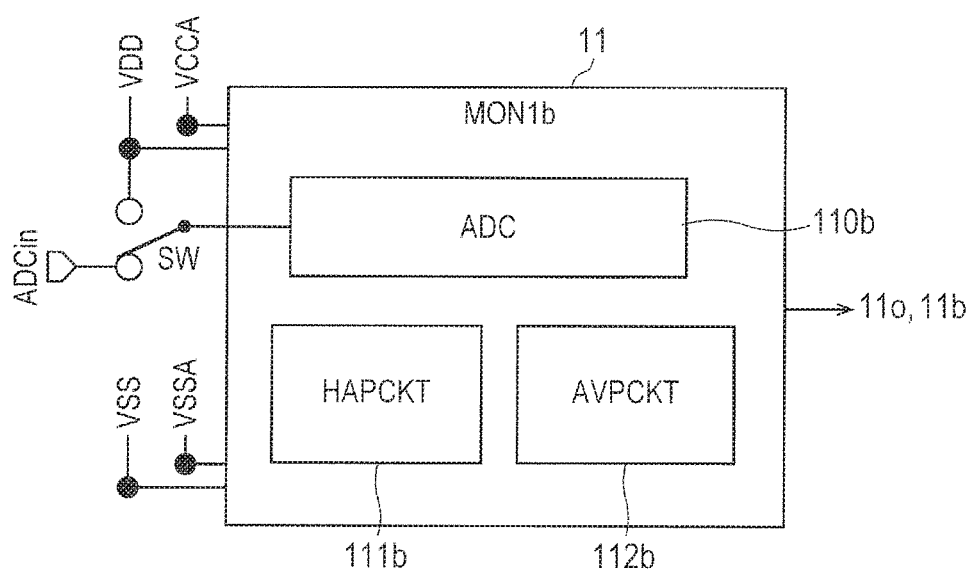
FIG. 4 is a diagram illustrating a configuration example of the first monitor circuit as a voltage monitor.

FIG. 4 is a diagram illustrating a configuration example of the first monitor circuit as a voltage monitor. The first monitor circuit (MON1b) 11 has an analog-to-digital conversion circuit (ADC) 110b, a higher-precision auxiliary circuit (HPACKT) 111b, and an absolute-value precision acquiring circuit (AVPCKT) 112b. The first monitor circuit (MON1b) 11 is coupled to the reference potential VDD as a first power supply voltage for a digital circuit and the reference potential VDDA as a second power supply potential for an analog circuit. The first monitor circuit (MON1a) 11 is coupled to the reference potential VSS as a first ground potential for a digital circuit and the reference potential VSSA as a second ground potential for an analog circuit.

As illustrated, one input terminal in a plurality of input terminals of the analog-to-digital conversion circuit (ADC) 110b can be coupled to any one of the reference potential VDD and an analog signal input terminal (ADCin) via a switch SW. In the case of operating as a voltage monitor, the analog-to-digital conversion circuit (ADC) 110b receives the reference potential VDD as an input via the switch SW and analog-to-digital converts the reference potential VDD. With such a configuration, the first monitor circuit (MON1a) 11 can output, for example, high-precision voltage information regarding the reference potential VDD as output signals (11o and 11b) of digital values.

Figure 5:
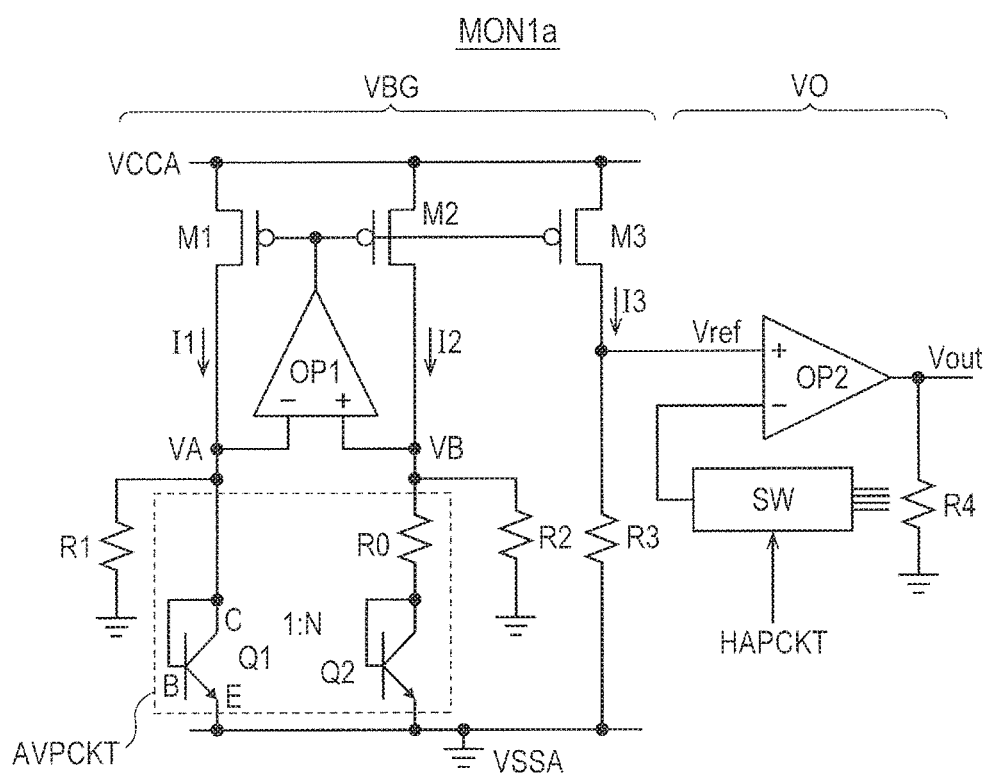
FIG. 5 is a diagram illustrating a circuit example of the first monitor circuit as a temperature monitor.

FIG. 5 is a circuit diagram illustrating a configuration example of the first monitor circuit as a temperature monitor. The first monitor circuit MON1a illustrated in FIG. 5 is an example of a temperature monitor using a band gap. The embodiment is not limited to the configuration of the first monitor circuit of FIG. 5 but various temperature monitors can be employed.

The first monitor circuit MON1a includes a reference potential generation circuit VBG generating reference voltage Vref and an output circuit VO receiving the reference potential Vref and generating an output potential Vout. The reference potential generation circuit VBG includes three PMOS transistors M1, M2, and M3 as current supplies, two NPN bipolar transistors Q1 and Q2 which are diode-coupled, an operational amplifier OP1 like a differential amplifier, and resistive elements R0, R1, R2, and R3. The resistive elements R1 and R2 have the same value (R1=R2). The output circuit VO includes an operational amplifier OP2 like a differential amplifier, a coupling switch SW, and a resistive element R4.

The source of each of PMOS transistors M1, M2, and M3 is coupled to a power supply potential VCCA for an analog circuit, and the gates of the PMOS transistors M1, M2, and M3 are commonly coupled. The drain of the PMOS transistor M1 is coupled to the collector C of the NPN bipolar transistor Q1, and the drain of the PMOS transistor M2 is coupled to the collector C of the NPN bipolar transistor Q2 via the resistive element R0.

The base B and the collector C of the NPN bipolar transistor Q1 are coupled to configure a diode. The emitter E of the NPN bipolar transistor Q1 is coupled to the reference potential VSSA for an analog circuit. Similarly, the base B and the collector C of the NPN bipolar transistor Q2 are coupled to configure a diode. The emitter E of the NPN bipolar transistor Q2 is coupled to the reference potential VSSA for an analog circuit. The drains of the PMOS transistors M1 and M2 are coupled to the reference potential VSSA via the resistive elements R1 and R2. The reference potential VSSA can be regarded as a ground potential.

The inversion terminal (−) of the operational amplifier OP1 is coupled to the drain of the PMOS transistor M1, and the non-inversion terminal (+) of the operational amplifier OP1 is coupled to the drain of the PMOS transistor M2. The drain of the PMOS transistor M3 is coupled to the reference potential VSSA via the resistive element R3.

The non-inversion terminal (+) of the operational amplifier OP2 is coupled to the drain of the PMOS transistor M3 and receives the reference potential Vref. The resistive element R4 is configured by a plurality of resistive elements which are coupled in series, and the coupling switch SW is configured by, for example, a plurality of MOS switch elements. Each of source-drain paths of the plurality of MOS switch elements is provided between the inversion terminal (−) of the operational amplifier OP2 and each of coupling points (k1, k2, . . . , kn) of the plurality of resistive elements. By setting one of the plurality of MOS switch elements to an ON state, the selected one coupling point is coupled to the inversion terminal (−) of the operational amplifier OP2. In such a manner, a voltage follower circuit is configured.

In FIG. 5, an absolute-value precision acquiring means AVPCKT is configured by the two NPN bipolar transistors Q1 and Q2 and the resistive element R0, and a higher-precision auxiliary circuit HAPCKT is configured by the coupling switch SW.

In the reference potential generation circuit VBG, the area ratio between the area of the emitter E of the NPN bipolar transistor Q1 and that of the emitter E of the NPN bipolar transistor Q2 is 1:N. In this configuration, current proportional to the absolute temperature flows in the resistive element R0. Since the operational amplifier OP1 makes the voltages of VA and VB the same voltage (VA=VB), as the current flowing in the resistive elements R1 and R2, the current proportional to the base-emitter voltage VBE flows. The currents flowing in the PMOS transistors M1, M2, and M3 are the same (I1=I2=I3).

In the case where the thermal voltage VT=kT/q (k denotes Boltzmann constant, q denotes elementary charge, and T denotes absolute temperature), when the same current (I1 and I2) is made to pass to the diode-coupled two NPN bipolar transistors Q1 and Q2 whose emitter area ratio is 1:N, the voltage difference ΔVBE between the emitter and base (the voltage difference between the emitter and base of Q1 and Q2 with respect to the ground voltage VSSA) becomes VT*ln(N). By the work of the operational amplifier OP1, VA and VB are equal. Therefore, the voltage across both ends of the resistive element R0 becomes VT*ln(N).

In such a manner, the absolute-value precision acquiring means AVPCK generates VT=kT/q, that is, the voltage VT*ln(N) proportional to temperature. By using addition of the voltage having positive dependency to the temperature T and the emitter-base voltage VBE having negative dependency, the value of N and the like is adjusted so that the output voltage does not have temperature dependency. By a similar method, it can be configured not to have arbitrary temperature dependency.

Next, the higher-precision auxiliary means HAPCKT in FIG. 5 will be described. The selection switch SW of the higher-precision auxiliary means HAPCKT designates the resistance division position of the resistive element R4 and sets reference voltage of the operational amplifier OP2. For example, when the selection switch SW designates the voltage in the position of k1*Vout (k1<1), the operational amplifier OP2 operates so that Vref=k1*Vout is satisfied. That is, when Vout=Vref/k1 and Vref=k2*T (T denotes absolute temperature), Vout=(k2/k1)*Vref. That is, by adjusting k1 by the selection switch SW, k2 which varies among processes is corrected to make the temperature coefficient of Vout constant. The position of the selection switch SW can be designated by a pre-shipment test for each chip.

As described above, since the higher-precision auxiliary circuit (HAPCKT) is configured by a plurality of MOS switch elements, its area is relatively large.

Next, the configuration of the NPN bipolar transistors Q1 and Q2 employed by the absolute-value precision acquiring means (AVPCKT) will be described.

Figure 6:
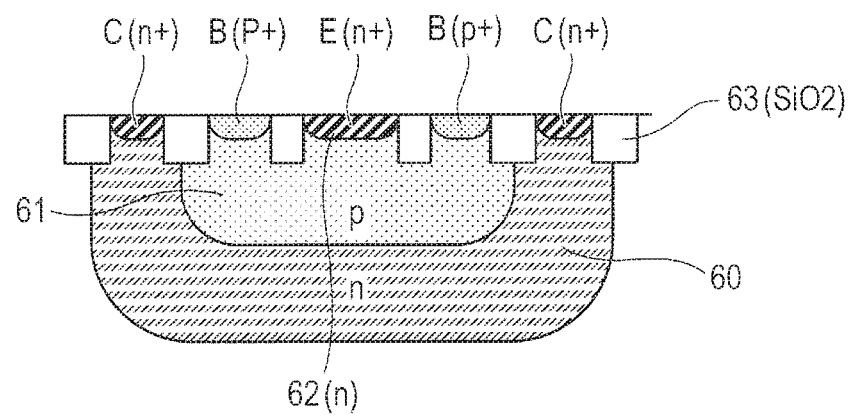
FIG. 6 is a cross section of a bipolar transistor in FIG. 5.

FIG. 6 is a cross section of a bipolar transistor in FIG. 5. It is a conceptual cross section of the bipolar transistor Q1 or Q2 as a component of the absolute-value precision acquiring means (AVPCKT). The bipolar transistors Q1 and Q2 are formed on a semiconductor chip or a semiconductor substrate made of silicon single-crystal as an NPN bipolar transistor formed by the CMOS process. The NPN bipolar transistor Q1 or Q2 has a deep N-type layer 60 as a collector region (C), a P-type layer 61 as a base region (B) formed in the N-type layer 60, and an N-type layer 62 as an emitter region (E) formed in the P-type layer 61. On the surface side of the semiconductor chip in the collector region 60, an N-type layer C (n+) having high impurity density for coupling the collector electrode and the collector region 60 at low resistivity is provided. Similarly, the base region 61 is provided with a P-type layer B (p+) having high impurity density for coupling the base electrode and the base region 61 at low resistivity. The emitter region 62 is provided with an N-type layer C (n+) having high impurity density for coupling the emitter electrode and the emitter region 62 at low resistivity. Reference numeral 63 denotes an insulating film such as a silicon oxide film (SiO2) used as element isolation or layer isolation.

As described above, the plane area of the bipolar transistor Q1 or Q2 becomes larger than that of a general MOS transistor by the deep N-type layer 60 and the P-type layer 61. Further, as described with reference to FIG. 5, the emitter area of the bipolar transistor Q2 is N times (for example, ten times) as large as that of the bipolar transistor Q1, so that the size or area of the plane of the bipolar transistor Q2 is larger than the size or area of the plane of the bipolar transistor Q1. Therefore, the general area of the absolute-value precision acquiring means AVPCK becomes relatively large.

Figure 7:
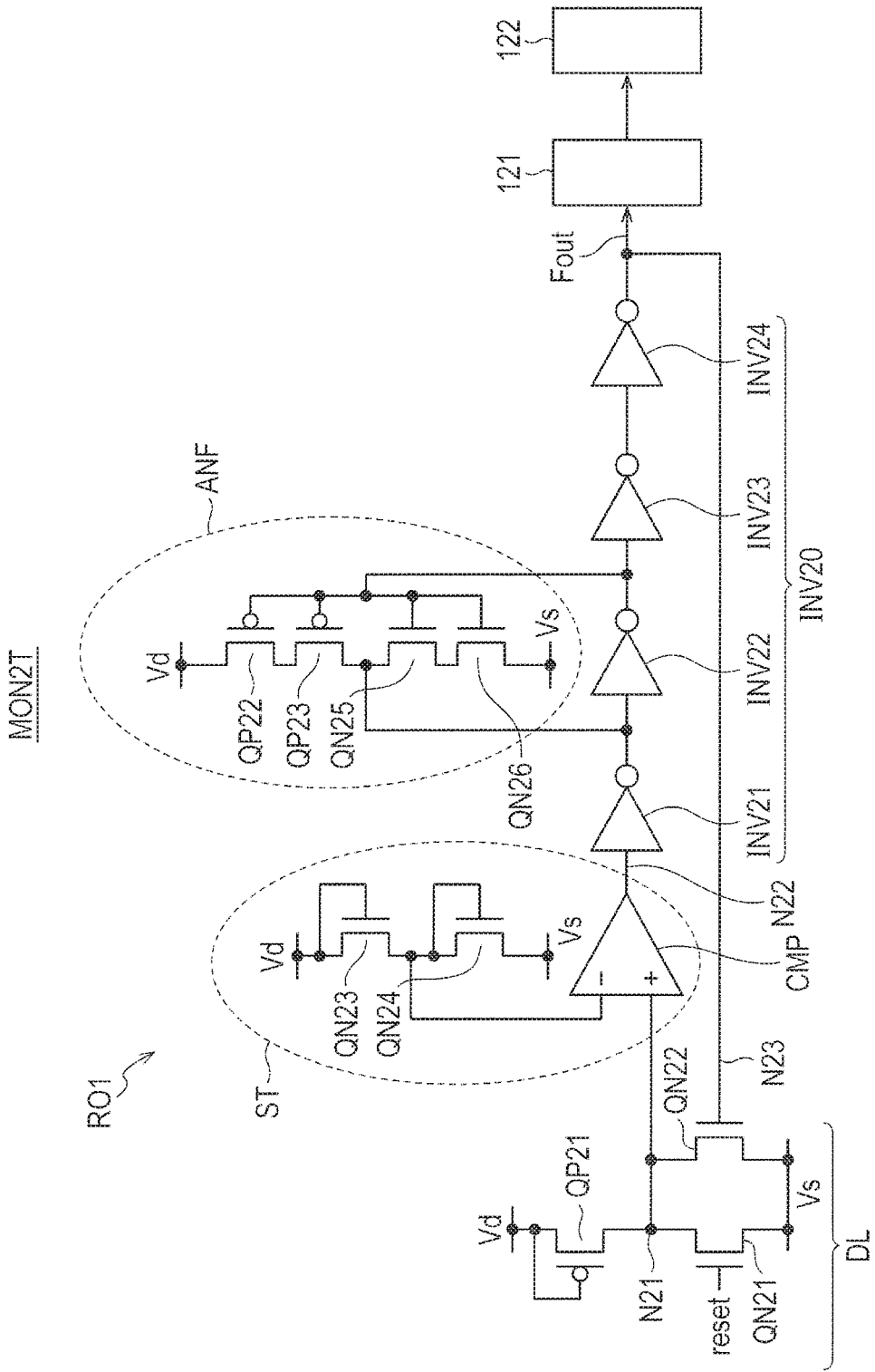
FIG. 7 is a diagram illustrating a configuration example of the second monitor circuit as a temperature monitor.

FIG. 7 is a diagram illustrating a configuration example of the second monitor circuit as a temperature monitor. The second monitor circuit MON2T as a temperature monitor is configured by the ring oscillator RO1. In the ring oscillator RO1, oscillation frequency Fout proportional to the off leak current of the PMOS transistor QP21 is realized. As a result, the oscillation frequency Fout is proportional to the exponent of the reciprocal of the temperature. The oscillation frequency Fout of the ring oscillator RO1 is counted by a counter circuit 121, and the count value of the counter circuit 121 is held in a register in a cumulative circuit 122.

The ring oscillator RO1 has a delay circuit DL, a stabilization circuit ST, and an inverter delay stage INV20. The delay circuit DL has a PMOS transistor QP21 and NMOS transistors QN21 and QN22. The stabilization circuit ST has NMOS transistors QN23 and QN24 generating reference voltage (Vref) and a comparator CMP. The inverter delay stage INV20 has inverters INV21, INV22, INV23, and INV24.

The operation will be described below. When a reset signal "reset" becomes the high level, a node N21 is reset to the low level. Vref is an intermediate potential between the high level (Vd) and the low level (Vs), and a node N22 of an output of the comparator (differential amplifier) CMP becomes the low level. As a result, the node N23 becomes the low level and, after the signal "reset" returns to the low level, the node N21 enters a floating state of the low level. When the threshold voltage absolute value of the NMOS transistors QN21 and QN22 is set to be larger than that of the PMOS transistor QP21, the off leak current of the PMOS transistor QP21 is dominant, and the potential of the node N21 gradually increases from the low level toward the high level. The PMOS transistor QP21 is a leak-type pull-up element. When the potential of the node N21 becomes Vref or larger, the node N22 of the output of the AMP comparator CMP changes from the low level to the high level and, after delay of the inverter delay stage INV20 (inverters INV21 to INV24 in four stages), the node N23 becomes the high level. As a result, the node N21 returns to the low level. By repeating the above, oscillation is performed.

The time since the node N21 becomes the low level, shifts to the high level, and becomes the low level again is almost equal to the sum of time (t1) in which the potential of the node N21 increases from the low level to Vref by the off leak current of the PMOS transistor QP21 and time (t2) in which the node N22 becomes the high level and the node N21 becomes the low level again due to delay of the inverter delay stage INV20. Further, since t1>>t2, the oscillation frequency Fout is almost proportional to the off leak current of the PMOS transistor QP21. Since the off leak current depends on the exponent (exp(−1/T)) of the reciprocal of the temperature, a ring oscillator having large temperature dependency can be realized.

As illustrated in FIG. 7, by receiving the node N21 by the comparator CMP not a normal logic circuit, an effect of stable oscillation operation is obtained. Specifically, since a change from the low level of the node N21 to the high level is very gentle, when an output is received by a logic circuit, there is a case that the change around the logic threshold value is propagated without being fully amplified and is stabilized around the logic threshold value without being fully amplified. Since an output of the comparator CMP changes from the low level to the high level around an input threshold value, a ring oscillator which stably oscillates at a full amplitude is obtained. An anti-noise feedback element ANF is inserted between the output and the input of the inverter INV22. The anti-noise feedback element ANF is an inverter configured by PMOS transistors QP22 and QP23 and NMOS transistors QN25 and QN26.

Figure 8:
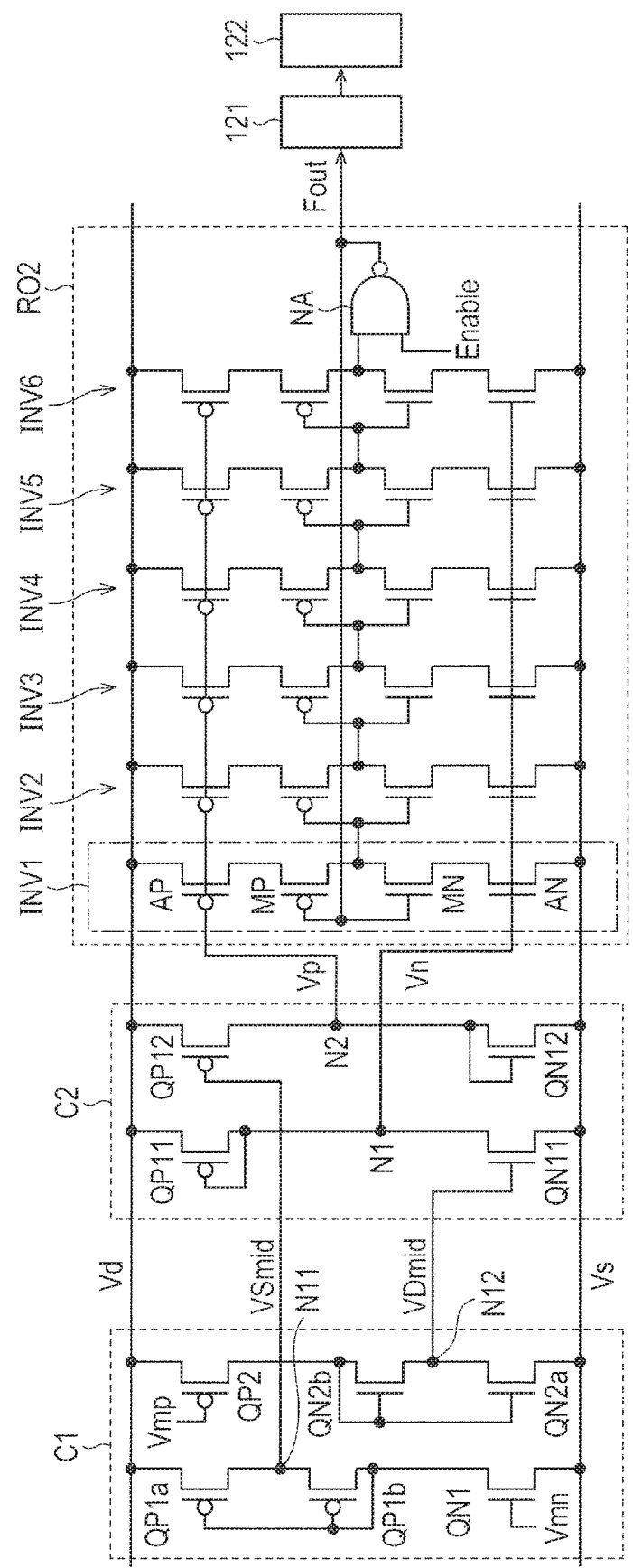
FIG. 8 is a diagram illustrating a configuration example of the second monitor circuit as a voltage monitor.

FIG. 8 is a diagram illustrating a configuration example of the second monitor circuit as a voltage monitor. The second monitor circuit MON2V as a voltage monitor has a ring oscillator RO2, a current supply control circuit C2 controlling a current source PMOS transistor AP and an NMOS transistor AN of the ring oscillator RO2, and a constant voltage generation circuit C1 for adjusting temperature dependency. The oscillation frequency Fout of the ring oscillator RO2 is counted by the counter circuit 121 like in FIG. 7, and the count value of the counter circuit 121 is held in the register in the cumulative circuit 122.

The ring oscillator RO2 oscillates when the loop path of the six inverters INV1 to INV6 driven by the current source and one NAND gate NA sets a signal (enable signal) applied to one of input terminals of the NAND gate NA to the high level. Each of the inverters INV1 to INV6 driven by the current source has the current supply PMOS transistor AP, the current supply NMOS transistor AN, the PMOS transistor MP, and the NMOS transistor MN. The source of the current supply PMOS transistor AP is coupled to a power supply line to which the power supply potential (Vd) is supplied, and the source of the current supply NMOS transistor AN is coupled to a reference line to which the reference potential (Vs) is supplied. When Vs=0V, the potential difference (voltage) between the power supply line and the reference line is Vd. Hereinbelow, in the case of describing voltage, it is a potential difference with respect to the potential of the reference line (Vs=0V). In the case of driving the next stage from the low level to the high level in the inverters INV1 to INV6 of the current supply driving, signal shift time is determined also in proportional to the drive current of the current supply PMOS transistor AP. In the case of driving the next stage from the high level to the low level, the signal transition time is determined almost in proportional to the drive current of the current supply NMOS transistor AN. The PMOS transistor MP and the NMOS transistor MN sandwiched by the current supply PMOS transistor AP and the current supply NMOS transistor AN and whose gates are common function as a switch selecting either the current supply PMOS transistor AP or the current supply NMOS transistor AN in accordance with an oscillation transient state. The gate voltage (Vp) of the current supply PMOS transistor AP and the gate voltage (Vn) of the current supply NMOS transistor AN are controlled by the current supply control circuit C2 so that the oscillation frequency of the output Fout has voltage dependency.

The constant voltage generation circuit C1 having temperature dependency has: PMOS transistors QP1a and QP1b which have sources coupled to a power supply line to which the power supply potential (Vd) is supplied and which are diode-coupled; and an NMOS transistor QN1 coupled between the drain of the PMOS transistor QP1b and a reference line to which the reference potential (Vs) is supplied. The constant voltage generation circuit C1 also has: NMOS transistors QN2a and QN2b which have sources coupled to the reference line to which the reference potential (Vs) is supplied and which are diode-coupled; and an NMOS transistor QP2 coupled between the drain of the NMOS transistor QN2b and the power supply line to which the power supply potential (Vd) is supplied.

The NMOS transistor QN1 is a transistor having a long channel, has a gate to which the potential (Vmn) is supplied, and is a component of effective resistance. The PMOS transistor QP2 is a transistor having a long channel, has a gate to which the potential (Vmp) is supplied, and is a component of effective resistance. A node N11 of the voltage generation circuit C1 is coupled to the gate of the PMOS transistor QP12 in the current supply control circuit C2 and supplies gate voltage (VSmid). A node N12 in the voltage generation circuit C1 is coupled to the gate of the NMOS transistor QN11 in the current supply control circuit C2 and supplies gate voltage (VDmid).

The current supply control circuit C2 is a circuit for emphasizing voltage dependency and has a PMOS transistor QP11 which has a source coupled to a power supply line to which the power supply potential (Vd) is supplied and is diode-coupled, and an NMOS transistor QN11 coupled between the drain (node N1) of the PMOS transistor QP11 and the reference line to which the reference potential (Vs) is supplied and receiving the gate voltage (VDmid) by its gate. The voltage generation circuit C2 also has: an NMOS transistor QN12 which has a source coupled to the reference line to which the reference potential (Vs) is supplied and which is diode-coupled; and a PMOS transistor QP12 coupled between the drain (node N2) of the NMOS transistor QN12 and the power supply line to which the power supply potential (Vd) is supplied and receiving the gate voltage (VSmid) by its gate. The node N1 supplies the gate voltage (Vn) to the gate of the current source NMOS transistor AN in the ring oscillator RO2. The node N2 supplies the gate voltage (Vp) to the gate of the current supply PMOS transistor AP in the ring oscillator RO2.

The output voltage Vn of the current supply control circuit C2 has a value obtained by shifting the power supply voltage (Vd) to low voltage corresponding to forward voltage (VBE) of the diode in the PMOS transistor QP11. When the voltage Vn is given as the gate voltage of the current supply NMOS transistor AN, at the time the power supply voltage changes to, for example, 0.8V to 1.2V, Vn changes to 0.2V to 0.5V (the half of the power supply voltage or less), so that the voltage dependency of the current is emphasized. The reason is that the voltage dependency of the current increases in a region where the gate voltage is low. The relation between the current supply control circuit C2 and the current supply PMOS transistor AP is similar. The output voltage Vp of the current supply control circuit C2 becomes a value obtained by shifting the reference voltage (Vs) to high voltage corresponding to the VBE of the diode in the NMOS transistor QN12. When the voltage Vp (½ or larger of the power supply voltage) is given as the gate voltage of the current supply PMOS transistor AP, the voltage dependency of the current is emphasized. The reason is that the voltage dependency of the current increases in a region where the gate voltage is high. That is, the ring oscillator RO2 can be regarded as a ring oscillator having voltage dependency or a ring oscillator for current supply control in which the voltage dependency is emphasized.

The output voltage (VSmid) and the output voltage (VDmid) of the voltage generation circuit C1 have temperature dependency. Modulation of VSmid and VDmid changes the effective resistance values of the PMOS transistor QP12 and the NMOS transistor QN11 of long channel and, as a result, changes the degree of conversion of the power supply voltage to low voltage. By adjusting the temperature dependency of the output voltages VSmid and VDmid by the voltage generation circuit C1, it can be adjusted so that the oscillation frequency of the ring oscillator RO2 does not show the temperature dependency, and the voltage dependency of the oscillation frequency of the ring oscillator RO2 can be adjusted to a desired state. That is, the gate voltages VSmid and VDmid generated by the voltage generation circuit C1 adjust so that the oscillation frequency of the ring oscillator RO2 does not show the temperature dependency and the gate voltages Vp and Vn generated by the current supply control circuit C2 depend on temperature.

Figure 9:
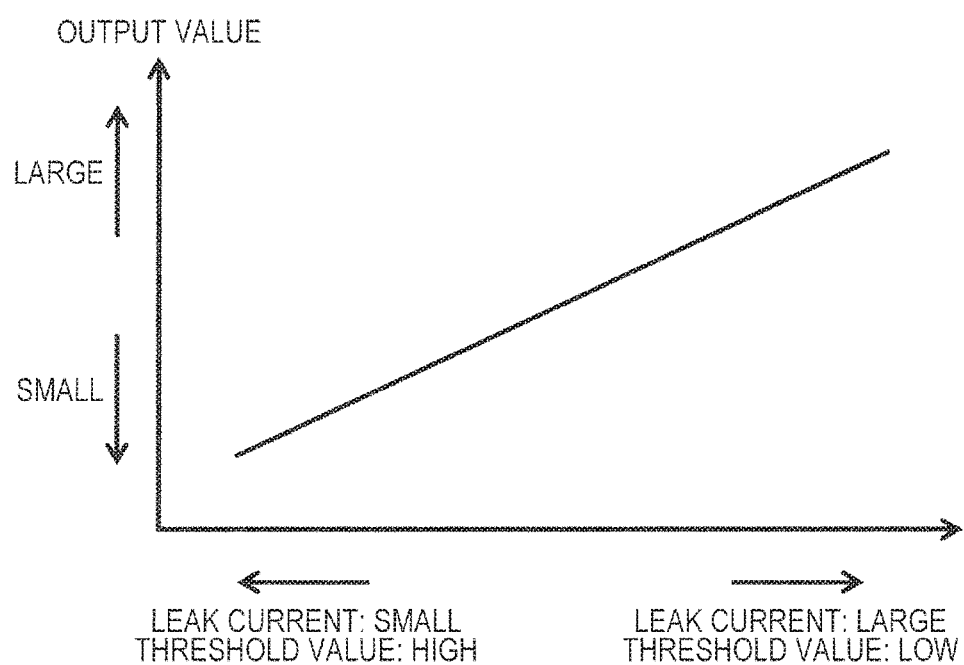
FIG. 9 is a diagram for explaining characteristics of an output value of the second monitor circuit in FIG. 7.

FIG. 9 is a diagram for explaining the characteristics of an output value of the second monitor circuit MON2T in FIG. 7. As illustrated in FIG. 9, an output value at predetermined temperature and voltage of the second monitor circuit MON2T depends on the process finish of the semiconductor device 100. Specifically, in a semiconductor chip in which the leak current is small and the threshold value is high, the output value is small. On the other hand, in a semiconductor chip in which the leak current is large and the threshold value is low, the output value is large. The characteristics of the output value of the second monitor circuit MON2V illustrated in FIG. 8 are similar to those of the output value in FIG. 9. However, the circuit configuration itself of the second monitor circuits MON2T and MON2V is simple and can be realized in a small area. According to the configuration examples illustrated in FIGS. 7 and 8, the second monitor circuit monitoring the first monitor circuit can be realized in a small area and, as a result, there is an effect that the high-reliable semiconductor device 100 can be realized at low cost.

Figure 10:
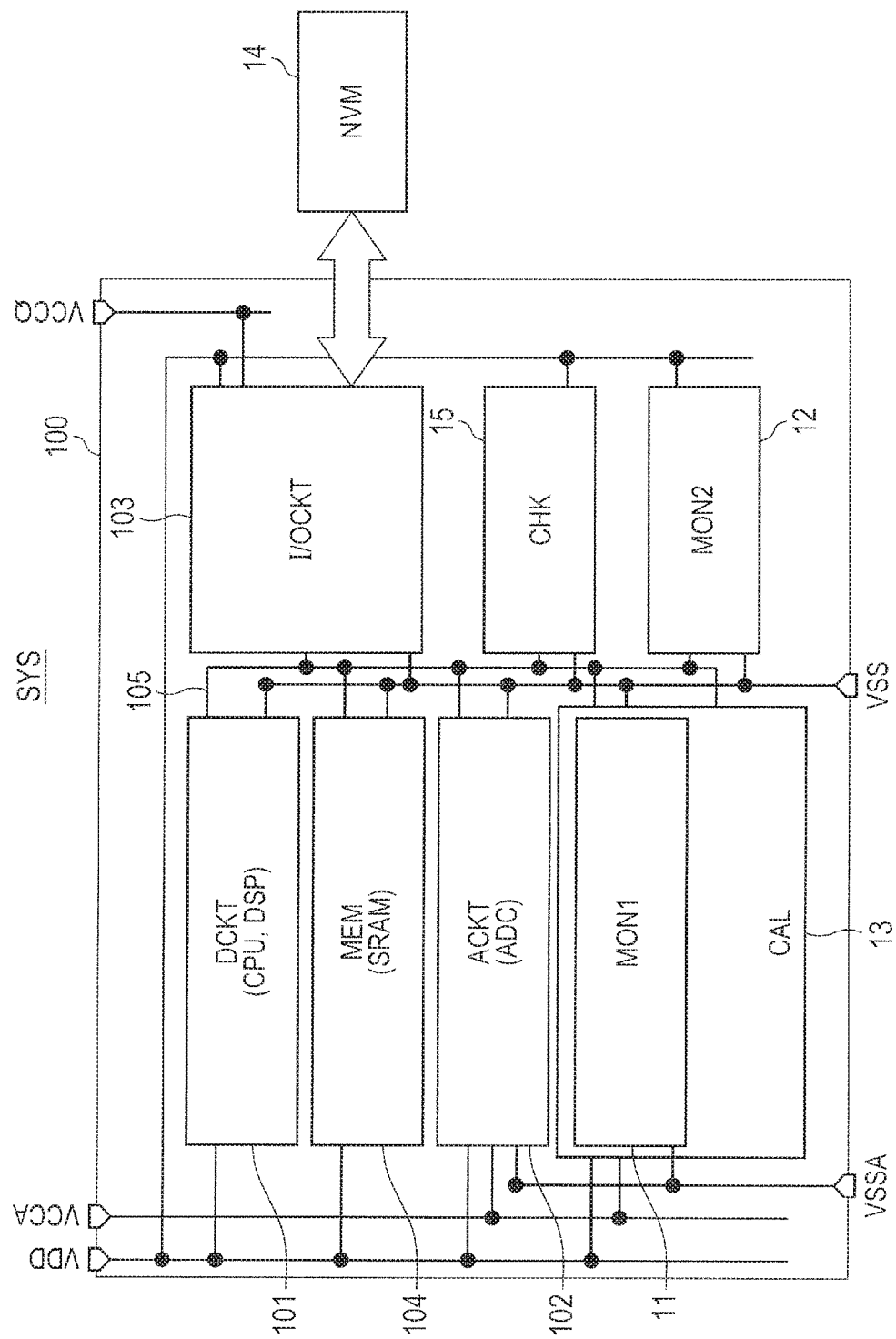
FIG. 10 is a block diagram illustrating a general configuration of a semiconductor system according to an embodiment.

FIG. 10 is a block diagram illustrating a general configuration of a semiconductor system according to an embodiment. A semiconductor system SYS has the semiconductor device 100 and an off-chip nonvolatile storage circuit 14. By the configuration as illustrated in FIG. 10, the monitor unit 1 in FIG. 1 can be provided for the semiconductor system SYS.

The semiconductor device 100 is provided with blocks of a digital circuit unit (DCKT) 101, an analog circuit unit (ACKT) 102, an input/output circuit unit (I/OCKT) 103 as an input/output circuit of the semiconductor device 100, and a volatile storage device (MEM) 104 and, in addition, the first monitor circuit (MON1) 11, the on-chip correction circuit (CAL) 13 including the first monitor circuit 11, the second monitor circuit (MON2) 12, and the on-chip check circuit (CHK) 15. The circuits (11, 12, 13, 15, and 101 to 103) in the semiconductor device 100 are mutually coupled via a bus 105. The digital circuit unit (DCKT) 101 includes, for example, a central processing unit CPU and a digital signal processor DSP. The analog circuit unit (ACKT) 102 includes, for example, an analog-to-digital conversion circuit (ADC). The volatile storage device (MEM) 104 includes, for example, a static random access memory (SRAM) used as a temporary data storage region of a data processing device such as the central processing unit CPU and a digital signal processor DSP.

Each of the circuits (11, 12, 13, 15, and 101 to 103) in the semiconductor device 100 is configured to receive the power supply potential VDD and the reference potential VSS. The analog circuit unit 102 and the first monitor circuit 11 are configured to receive the power supply potential VCCA for an analog circuit and the reference potential VSSA for an analog circuit. The input/output circuit unit 103 is configured to receive the power supply potential VCCQ for an input/output circuit.

The off-chip nonvolatile storage circuit (NVM) 14 is coupled to the semiconductor device 100 via the input/output (I/O) circuit unit 103. The off-chip nonvolatile storage circuit 14 is configured by a nonvolatile storage device such as a flash memory.

Figure 11:
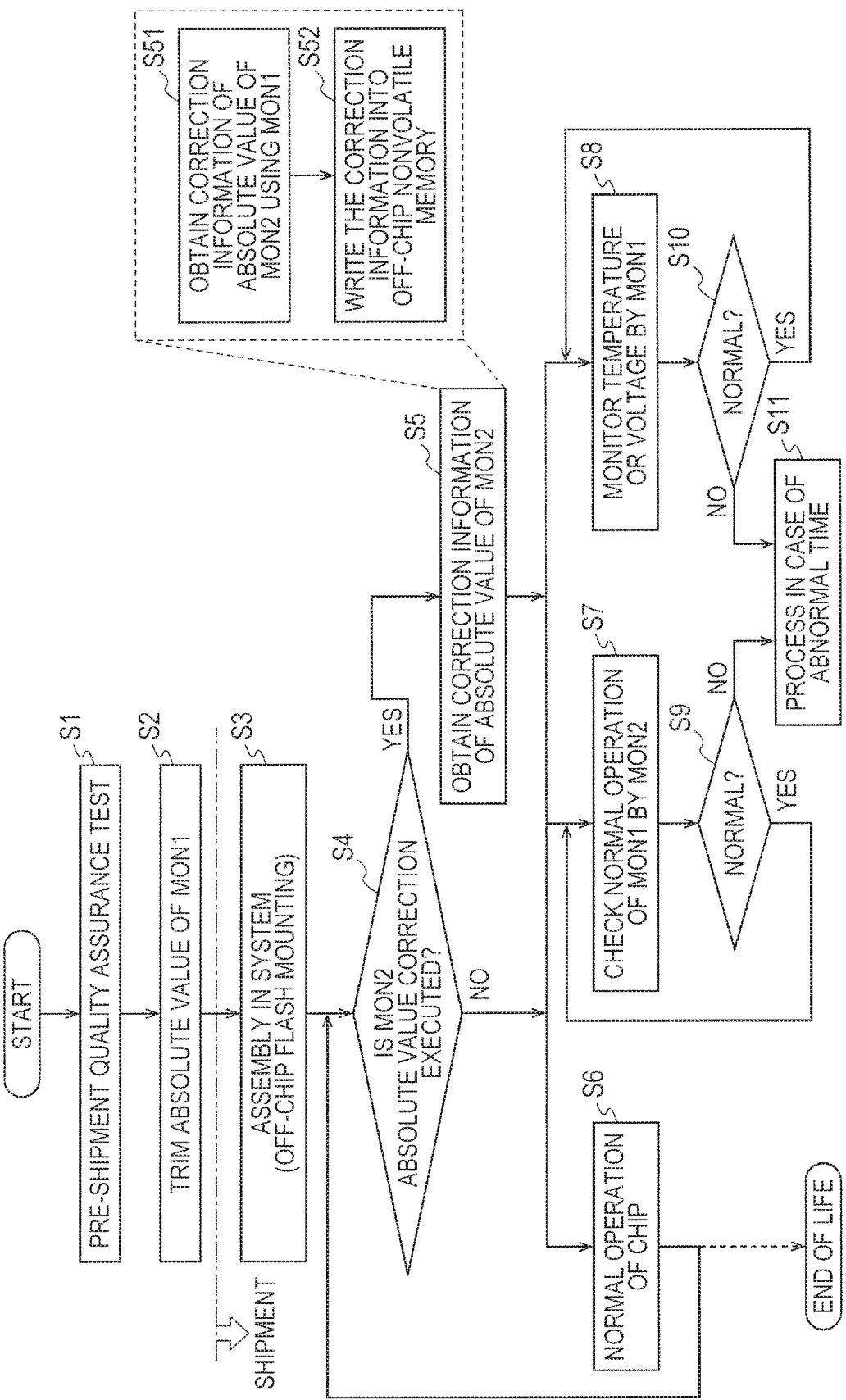
FIG. 11 is a diagram explaining a process flow according to the embodiment.

FIG. 11 is a diagram explaining a process flow according to the embodiment.

On the semiconductor device 100, before shipment, a normal quality assurance test is executed (step S1). As necessary, trimming of the absolute value of the first monitor circuit (MON1) is executed (step S2). When sufficient absolute value precision is obtained by the absolute-value precision acquiring circuit (AVPCKT) 112 in the first monitor circuit (MON1), the trimming in step S2 is unnecessary.

After shipment, the semiconductor device 100 is mounted together with the off-chip nonvolatile storage circuit (NVM) 14 into the semiconductor system SYS. Subsequently, whether correction of the absolute value of the second monitor circuit (MON2) 12 is executed or not is determined (step S4). When the correction of the absolute value of the second monitor circuit (MON2) 12 is executed in step S4 (Yes), the process shifts to step S5. Since the correction of the absolute value of the second monitor circuit (MON2) 12 is performed by using the output value 11a of the first monitor circuit (MON1) in step S5, the correction information 13a used for correction is obtained (step S51), and the obtained correction information 13a is written into the off-chip nonvolatile storage circuit (NVM) 14 (step S52).

When the correction of the absolute value of the second monitor circuit (MON2) 12 is not performed in the step S4 (No) and after execution of the step S5, the following three operations are performed in parallel.

(1) Normal operation of the semiconductor device 100 (step S6)

(2) Check of the normal operation of the first monitor circuit (MON1) 11 by the second monitor circuit (MON2) 12 (steps S7 and S9)

(3) Monitoring of the temperature or voltage of the semiconductor device 100 by the first monitor circuit (MON1) 11 (steps S8 and S10)

The operation (2) is performed by the on-chip check circuit (CHK) 15 and the frequency of the operation may be low. For example, it may be executed once after resetting of the semiconductor device 100.

When abnormality is detected in the operation (2) or (3) (No in the step 9 or S10), a predetermined process such as the notification 15o of abnormality occurrence to the outside is performed (step S11). In case of Yes in the step S9 or S10, the process shifts to the step S7 or S8.

Figure 12:
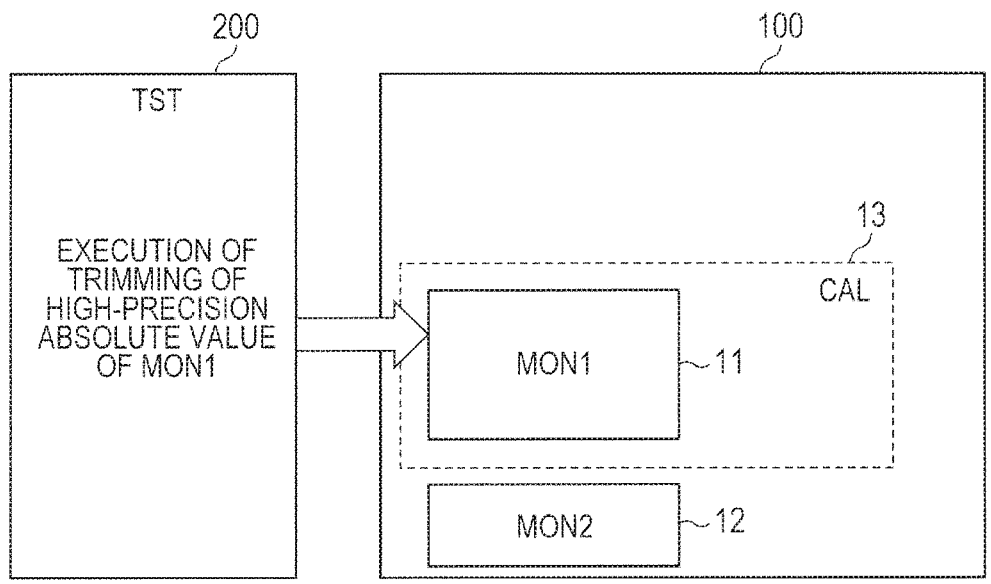
FIG. 12 is a diagram explaining a method of executing steps S1 and S2.
Figure 13:
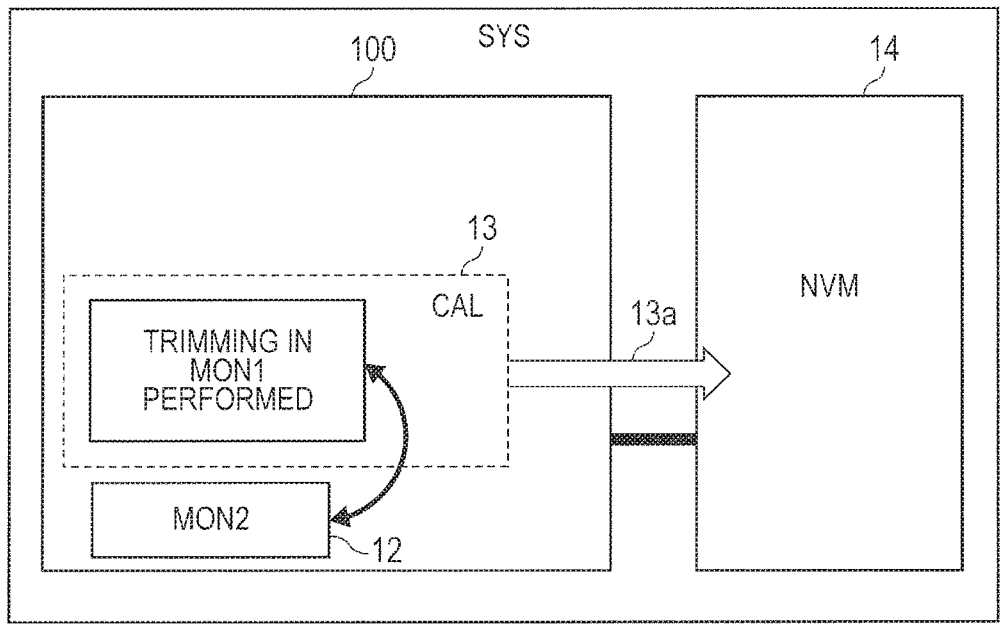
FIG. 13 is a diagram explaining a method of executing step S5.

FIG. 12 is a diagram explaining a method of executing the steps S1 and S2. FIG. 13 is a diagram explaining a method of executing the step S5. As illustrated in FIG. 12, at the time of a pre-shipment test of the semiconductor device 100, high-precision trimming of the absolute value of the output value of the first monitor circuit (MON1) 11 is executed by using a tester TST. As illustrated in FIG. 13, at the time of actual use in the market of the semiconductor device 100, the calibration information 13a for correcting the absolute value of the output value of the second monitor circuit (MON2) 12 is obtained by the on-chip correction circuit (CAL) 13 including the first monitor circuit (MON1) 11 and, the correction information 13a is written in the off-chip nonvolatile storage circuit (NVM) 14 mounted in the semiconductor system SYS after shipment.

Figure 14:
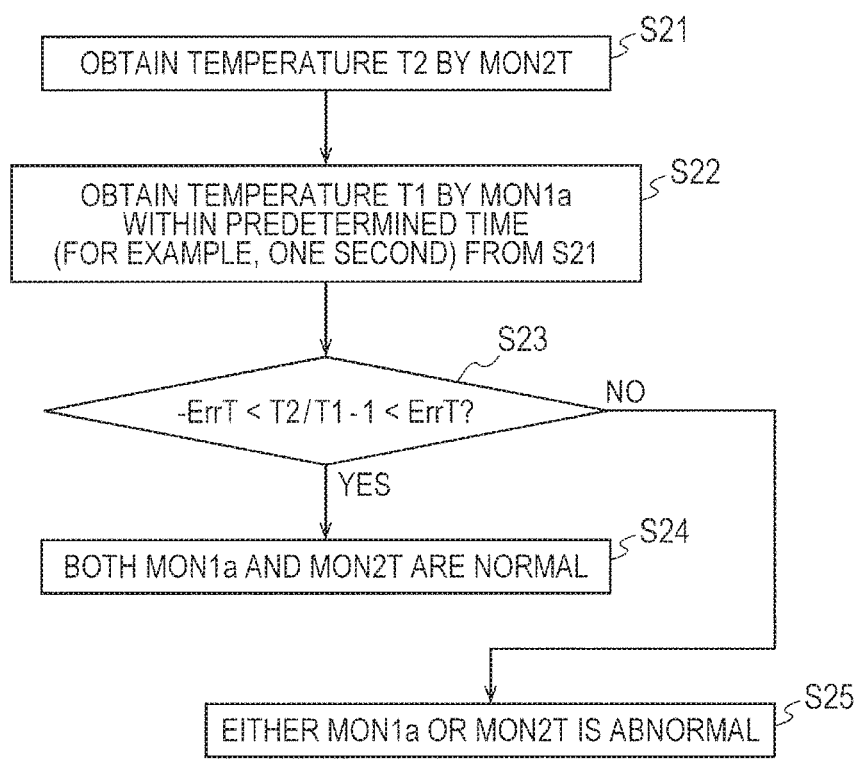
FIG. 14 is a diagram explaining an operation flow of an on-chip check circuit.

FIG. 14 is a diagram explaining an operation flow of an on-chip check circuit. It is a check or determination flow of the on-chip check circuit 15 in the case of using the first monitor circuit MON1a in FIG. 3 and the second monitor circuit MON2T in FIG. 7. In step S21, the on-chip check circuit 15 obtains temperature T2 by the second monitor circuit MON2T. The temperature T2 is a value obtained by correcting the output value of the second monitor circuit MON2T to temperature by using the correction information 13a stored in the off-chip nonvolatile storage circuit (NVM) 14. Subsequently, the on-chip check circuit 15 obtains the temperature T1 by the first monitor circuit MON1a within predetermined time (for example, one second) from execution of the step S21 (step S22). After the step S22, the on-chip check circuit 15 executes step S23. In the step S23, whether the temperature T1 or T2 obtained in the step S21 or S22 lies within the predetermined temperature range or not is determined according to the following equation.

$$-\text{Err}T < ((T2/T1)-1) < \text{Err}T$$

Where −ErrT is a value expressing the lower limit value of the range of the predetermined temperature. ErrT is a value expressing the upper limit value of the range of the predetermined temperature.

When the temperatures T1 and T2 are within the predetermined temperature range (Yes) in the step S23, it is determined that both of the first and second monitor circuits MON1a and MON2T perform the normal operation. On the other hand, when the temperature T1 or T2 lies out of the predetermined temperature range in the step S23 (No), it is determined that either the first monitor circuit MON1a or the second monitor circuit MON2T is abnormal.

The steps S21 to S25 may be configured by a dedicated circuit or software made by a CPU and the like.

Figure 15:
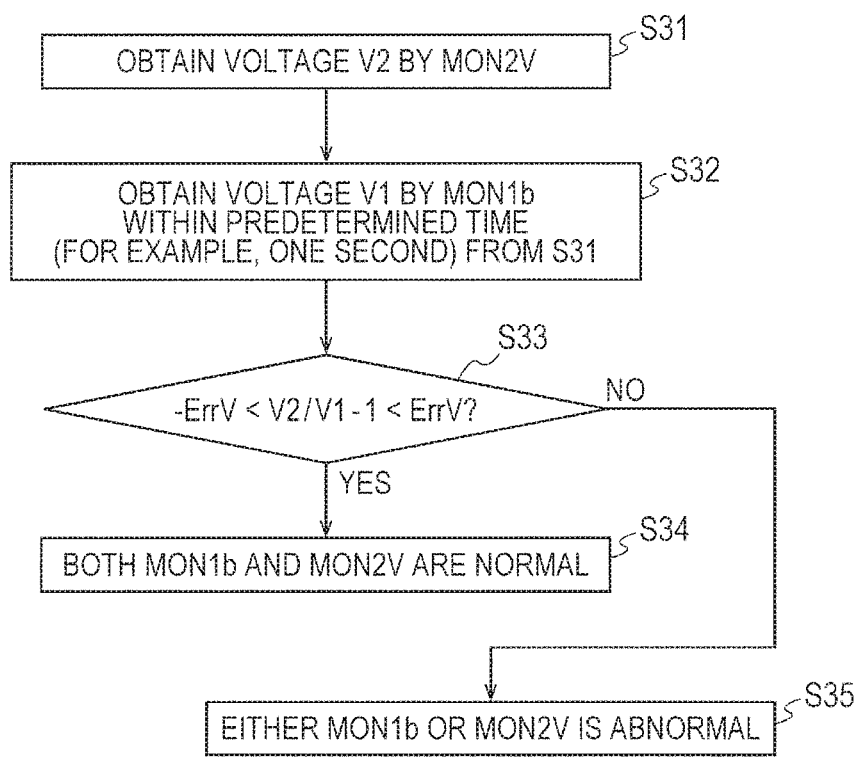
FIG. 15 is a diagram explaining an operation flow of an on-chip check circuit.

FIG. 15 is a diagram explaining an operation flow of the on-chip check circuit. It is a check or determination flow of the on-chip check circuit 15 in the case of using the first monitor circuit MON1b in FIG. 4 and the second monitor circuit MON2V in FIG. 8. In step S31, the on-chip check circuit 15 obtains the voltage V2 by the second monitor circuit MON2V. The voltage V2 is a value obtained by correcting the output value of the second monitor circuit MON2V to voltage by using the correction information 13a stored in the off-chip nonvolatile storage circuit (NVM) 14. Subsequently, the on-chip check circuit 15 obtains the voltage V1 by the first monitor circuit MON1b within the predetermined time (for example, one second) since execution of the step S31 (step S32). After the step S32, the on-chip check circuit 15 executes the step S33. In the step S33, whether the voltages V1 and V2 obtained in the steps S31 and S32 lie within the predetermined voltage range or not is determined according to the following equation.

$$-ErrV < ((V2/V1)-1) < ErrV$$

Where $-ErrV$ is a value expressing the lower limit value of the range of the predetermined voltage. $ErrV$ is a value expressing the upper limit value of the range of the predetermined voltage.

When the voltages V1 and V2 are within the predetermined voltage range (Yes) in the step S33, it is determined that both of the first and second monitor circuits MON1b and MON2V perform the normal operation. On the other hand, when the voltage V1 or V2 lies out of the predetermined voltage range in the step S33 (No), it is determined that either the first monitor circuit MON1b or the second monitor circuit MON2V is abnormal.

The steps S31 to S35 may be configured by a dedicated circuit or software made by a CPU and the like.

FIGS. 16A to 16C are diagrams explaining correction information in the case where the first and second monitor circuits are temperature monitor circuits. For example, the output value Fout of the second monitor circuit MON2T in FIG. 7, that is, the oscillation frequency of the ring oscillator is according to the following equation 1.

$$Fout = C1 * \exp(-Ea/kT) \qquad \text{(Equation 1)}$$

where $Ea$ denotes temperature dependency coefficient, $k$ denotes Boltzmann constant, and $T$ denotes absolute temperature. $C1$ denotes a constant which varies depending on the process finish every semiconductor chip. $Ea$ denotes an almost constant value regardless of the semiconductor chip. In the graphs of FIGS. 16A, 16B, and 16C, the horizontal axis denotes reciprocal $1/kT$ of the temperature obtained by the first monitor circuit MON1a, and the longitudinal axis indicates the logarithm (log (Fout)) of the output value Fout of the second monitor circuit MON2T. The region R indicates a low-temperature region except for the operation assurance range of the second monitor circuit MON2T.

FIG. 16A indicates the case of the first time of acquisition of the correction information 13a of the absolute value of the second monitor circuit MON2T. That is, a measurement point 1 is plotted using the reciprocal $1/kT$ of the temperature T obtained by the first monitor circuit MON1a as the horizontal axis and using the logarithm of the output value Fout of the second monitor circuit MON2T as the vertical axis. By fitting the equation 1 so as to pass the measurement point 1, C1 is obtained. Line L1 indicates a line passing the measurement point 1 with an inclination of the temperature dependency $\exp(-Ea/kT)$ of the second monitor circuit MON2T assumed at the shipment of the semiconductor device 100.

FIG. 16B indicates the case of the second time of acquisition of the correction information 13a of the absolute value of the second monitor circuit MON2T. Like in FIG. 16A, a measurement point 2 is plotted using the reciprocal $1/kT$ of the temperature T obtained by the first monitor circuit MON1a as the horizontal axis and using the logarithm of the output value Fout of the second monitor circuit MON2T as the vertical axis. By fitting the equation 1 so that an error becomes the minimum with respect to the obtained measurement point 1 and the measurement point 2 added, new C1 is obtained. That is, Line L2 in which the error between the measurement points 1 and 2 becomes the minimum with an inclination of the temperature dependency $\exp(-Ea/kT)$ of the second monitor circuit MON2T assumed at the shipment of the semiconductor device 100 is obtained. Consequently, C1 of precision higher than that in FIG. 16A is obtained.

Similarly, as illustrated in FIG. 16C, at the N-th execution time of obtaining the correction information of the absolute value of the second monitor circuit MON2T, by fitting the equation 1 so that an error becomes minimum with respect to obtained N dots, C1 of higher precision can be obtained. That is, a line Ln which has a minimum error with respect to measurement points 1, 2, ... N at the inclination of the temperature dependency $\exp(-Ea/kT)$ of the second monitor circuit MON2T assumed at the time of shipment of the semiconductor device 100 is obtained. By the operation, C1 whose precision is higher than that in FIG. 16B is obtained.

By obtaining precise C1 as described above, the temperature (T2) of the semiconductor device 100 at that time point can be obtained relatively accurately from the output value (Fout) of the second monitor circuit MON2T. Therefore, by using the operation flow of the on-chip check circuit 15 described with reference to FIG. 14, the operation of the first monitor circuit MON1 can be monitored by using the second monitor circuit MON2.

Figure 17:
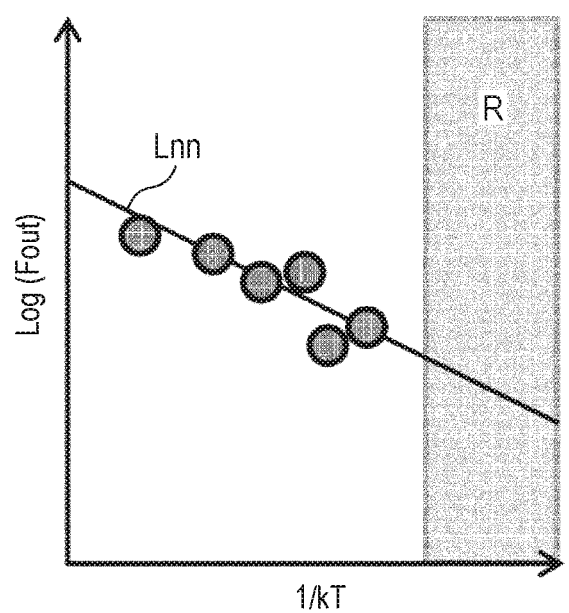
FIG. 17 is a diagram explaining another fitting method.

FIG. 17 is a diagram explaining another fitting method. The horizontal and vertical axes are similar to those in FIGS. 16A to 16C. In FIGS. 16A to 16C, the method of accurately obtaining C1 was described. In FIG. 17, the fitting of the equation 1 is performed so that an error becomes the minimum with respect to N dots using not only C1 but also the temperature-dependent factor Ea as fitting variables at the time of the N-th execution of obtaining the correction information of the absolute value of the second monitor circuit MON2T. That is, the line Ln with which errors become minimum from the measurement point 1 to the measurement point N is obtained. By the operation, the correction information 13a which is more accurate with respect to an output value (Fout) of the second monitor circuit MON2T can be obtained.

Figure 18A:
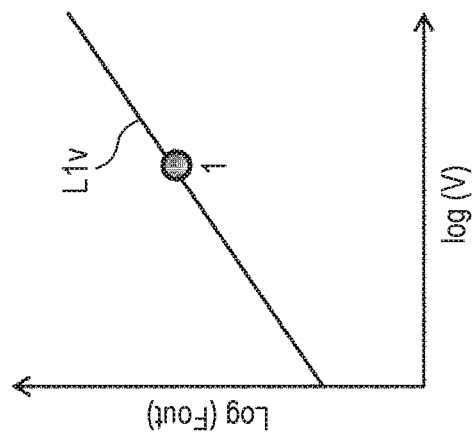
FIGS. 18A to 18C are diagrams explaining correction information in the case where the first and second monitor circuits are voltage monitor circuits.
Figure 18B:
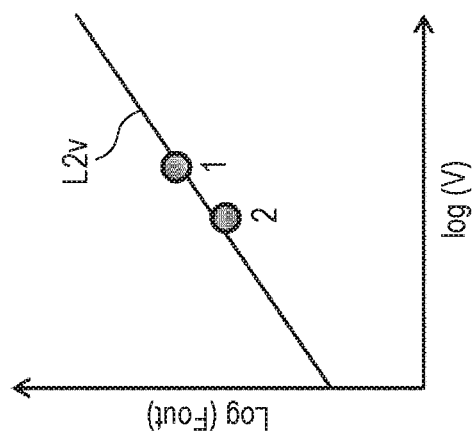
Figure 18C:
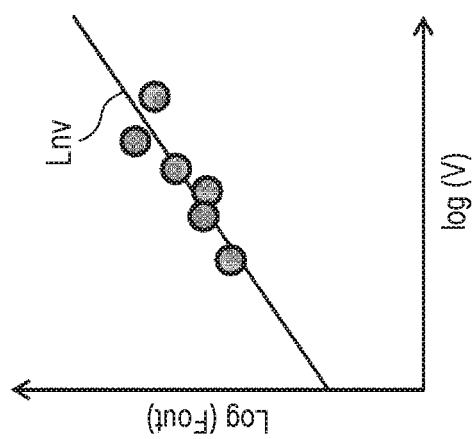

FIGS. 18A to 18C are diagrams explaining correction information in the case where the first and second monitor circuits are voltage monitor circuits. For example, the output value Fout of the second monitor circuit MON2V illustrated in FIG. 8, that is, the oscillation frequency of the ring oscillator is according to the following equation 2.

$$F_{out} = D1 * V\hat{}n \quad \text{Equation (2)}$$

Where D1 denotes a constant which varies depending on process finish of semiconductor chips. V denotes voltage, and V^n denotes n-th power of V.

As described with reference to FIGS. 16A to 16C, as C1 in the equation 1 is obtained by fitting, D1 in the equation 2 can be obtained by fitting. The horizontal axis of each of FIGS. 18A, 18B, and 18C indicates the logarithm of the voltage V obtained by the first monitor circuit MON1b, and the longitudinal axis indicates the logarithm (log (Fout)) of the output value Fout of the second monitor circuit MON2V.

FIG. 18A indicates the case of the first time of acquisition of the correction information 13a of the absolute value of the second monitor circuit MON2T. That is, a measurement point 1 is plotted using the logarithm of the voltage V obtained by the first monitor circuit MON1b as the horizontal axis and using the logarithm of the output value Fout of the second monitor circuit MON2V as the vertical axis. By fitting the equation 2 so as to pass the measurement point 1, D1 is obtained. Line L1v indicates a line passing the measurement point 1 with an inclination of the voltage dependency V^n of the second monitor circuit MON2V assumed at the shipment of the semiconductor device 100.

FIG. 18B indicates the case of the second time of acquisition of the correction information 13a of the absolute value of the second monitor circuit MON2V. Like in FIG. 18A, a measurement point 2 is plotted using the logarithm of the voltage V obtained by the first monitor circuit MON1b as the horizontal axis and using the logarithm of the output value Fout of the second monitor circuit MON2V as the vertical axis. By fitting the equation 2 so that an error becomes the minimum with respect to two points of the obtained measurement points 1 and 2, new D1 is obtained. That is, Line L2v in which the error with respect to the measurement points 1 and 2 becomes the minimum with an inclination of the voltage dependency V^n of the second monitor circuit MON2V assumed at the shipment of the semiconductor device 100 is obtained. Consequently, D1 of precision higher than that in FIG. 18A is obtained.

Similarly, as illustrated in FIG. 18C, at the N-th execution time of obtaining the correction information of the absolute value of the second monitor circuit MON2V, by fitting the equation 2 so that an error becomes minimum with respect to obtained N dots, D1 of higher precision can be obtained. That is, a line Lnv which has a minimum error with respect to measurement points 1, 2, . . . N at the inclination of the voltage dependency V^n of the second monitor circuit MON2V assumed at the time of shipment of the semiconductor device 100 is obtained. By the operation, D1 whose precision is higher than that in FIG. 18B is obtained.

By obtaining precise D1 as described above, the voltage (V2) of the semiconductor device 100 at that time point can be obtained relatively accurately from the output value (Fout) of the second monitor circuit MON2V. Therefore, by using the operation flow of the on-chip check circuit 15 described with reference to FIG. 15, the operation of the first monitor circuit MON1 can be monitored by using the second monitor circuit MON2.

Figure 19:
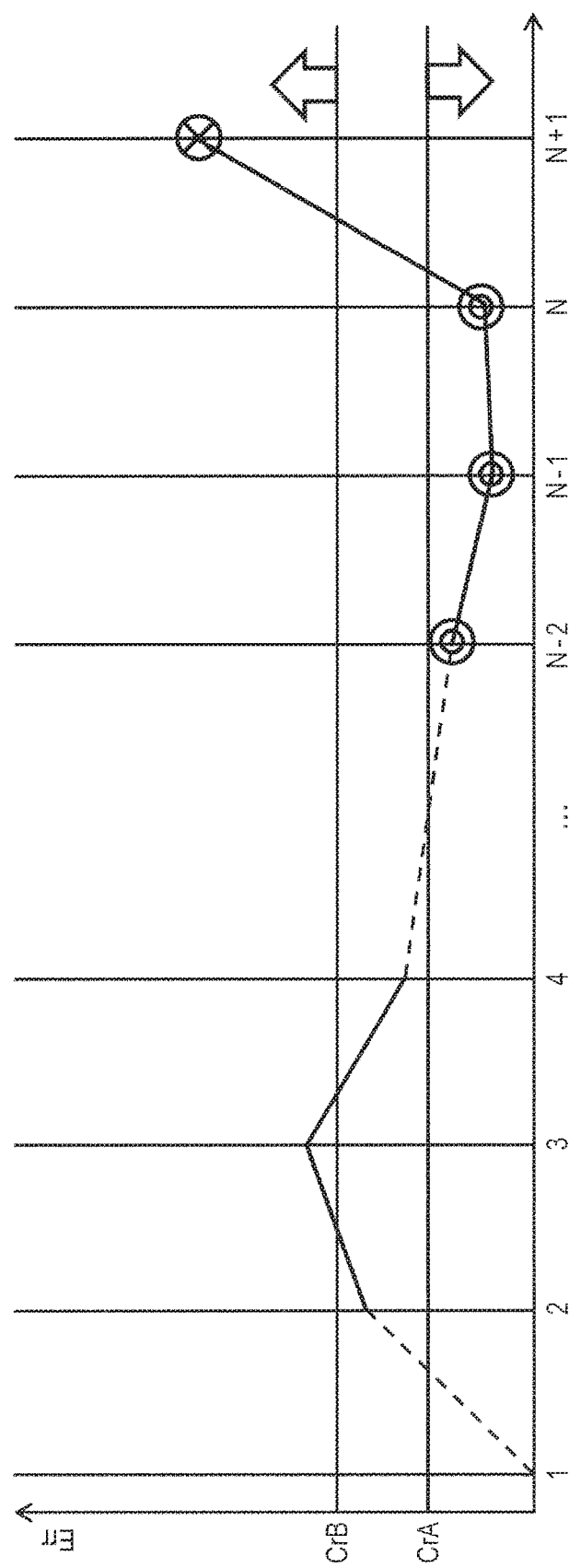
FIG. 19 is a diagram explaining criteria of updating correction information.

FIG. 19 is a diagram explaining criteria of updating correction information. FIG. 19 illustrates criteria based on an error Err with a measurement point obtained by the equation 1 or 2 determined by the method described in FIG. 16 or 18, and temperature measurement or voltage measurement of the first monitor circuit MON1 for correcting the absolute value of the second monitor circuit MON2 and measurement of the output value of the second monitor circuit MON2 newly executed. In FIG. 19, the vertical axis indicates the value of the error Err of a new measurement point from an approximate line until the previous time, and the horizontal axis indicates the number of measurement times.

The value of the error Err of a new measurement point from the approximate line until the previous time can be determined by, for example, a criterion CrA and a criterion CrB. When the absolute value of the error Err is smaller than the criterion CrA, for example, when the number of measurement times is N−2, N−1, or N, updating with the approximate line equation 1 or 2 obtained in FIG. 16 or 18 is not updated. It produces an effect that an equation is not updated unnecessarily.

On the other hand, when the absolute value of the error Err is larger than the criterion CrB, for example, when the number of measurement times is N+1, a failure of the first or second monitor circuit MON1 or MON2 is suspected. It is preferable to perform the determination after the approximate line becomes almost stable. For example, after the approximate line equation 1 or 2 is not updated predetermined number of times, the criterion B is made effective. It produces an effect that a failure in the first or second monitor circuit MON1 or MON2 can be determined quantitatively.

Figure 20A:
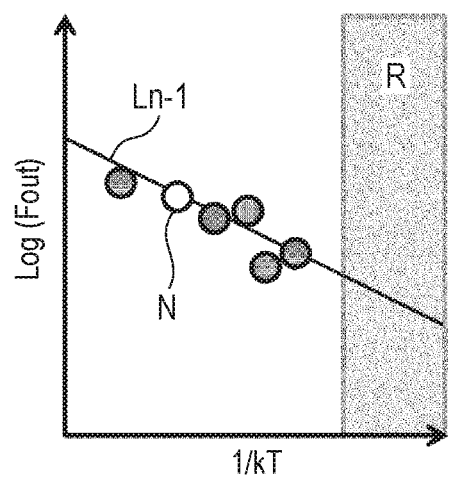
FIGS. 20A and 20B are diagrams illustrating an example of a method of calculating an error Err.
Figure 20B:
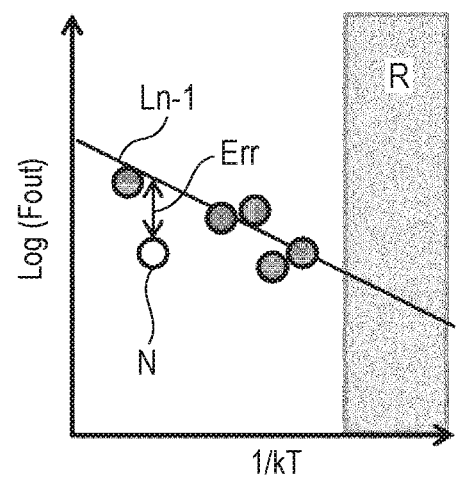

FIGS. 20A and 20B are diagrams illustrating an example of a method of calculating the error Err. FIGS. 20A and 20B illustrate a method of calculating the error Err, for example, in the case where the first and second monitor circuits are temperature monitor circuits as described with reference to FIGS. 16A to 16C. In FIGS. 20A and 20B, like FIGS. 16A to 16C, the horizontal axis indicates the reciprocal 1/kT of the temperature T obtained by the first monitor circuit MON1a, and the vertical axis indicates the logarithm (log (Fout)) of the output value Fout of the second monitor circuit MON2T.

FIG. 20A illustrates the case where the error Err at the measurement point N of the N-th time is smaller than an approximate line Ln−1 until the N−1th time. In this case, the measurement point N almost matches on the approximate line Ln−1, and the error Err is almost zero. On the other hand, FIG. 20B illustrates the case where the error Err is large. In this case, the measurement point N of the N-th time of the output value of the second monitor circuit MON2T is apart from the approximate line Ln−1 until the N−1th time only by the distance of the error Err. That is, the error Err is determined as an apart distance between the measurement point N and the approximate line Ln−1 until the N−1th time.

As described above, there is an effect that increase in the precision by the correction information 13a to the output value of the second monitor circuit MON2 of temperature or voltage can be performed in the semiconductor device 100 and the semiconductor system SYS after shipment of the semiconductor device 100 and the semiconductor system SYS. Therefore, it is unnecessary to correct the absolute value of the output value of the second monitor circuit MON2 at the time of a pre-shipment test of the semiconductor device 100, so that the test cost for correction of the absolute value of the output value of the second monitor circuit MON2 can be reduced. In addition determination of a failure of the first monitor circuit MON1 or the second monitor circuit MON2 can be performed quantitatively.

Modification

Figure 21B:
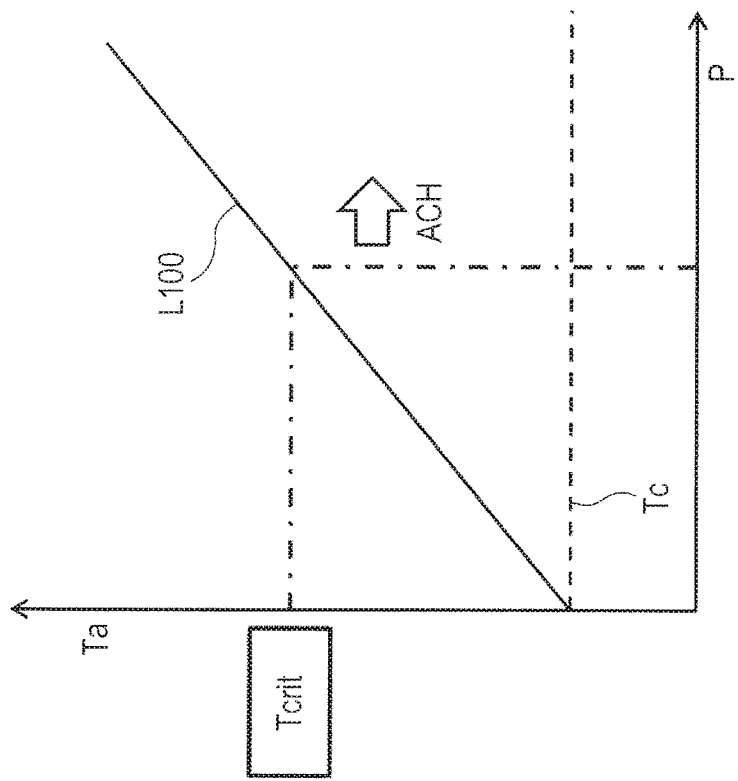
FIGS. 21A and 21B are diagrams explaining a method of obtaining correction information for an output value of a second monitor circuit according to a modification.
Figure 21A:
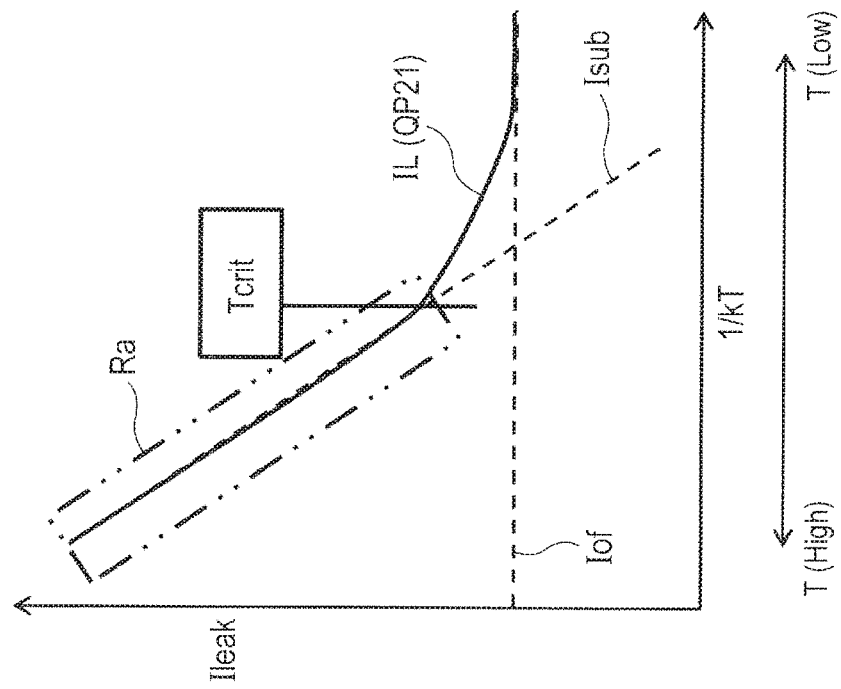

FIGS. 21A and 21B are diagrams explaining a method of obtaining correction information for an output value of a second monitor circuit according to a modification. The second monitor circuit MON2T illustrated in FIG. 7 is a temperature monitor using the temperature dependency of leak current of the PMOS transistor QP2. There is a problem that precision in a region (refer to a region R in FIG. 16) of low temperature cannot be obtained in an output value of the second monitor circuit MON2T.

FIG. 21A illustrates characteristics of a leak current (IL (GP21)) of the PMOS transistor QP2 setting the leak current (Ileak) on the vertical axis and the reciprocal 1/kT of the temperature T on the horizontal axis. In FIG. 21A, T(Low) denotes low temperature, T(High) denotes high temperature, and Ra denotes a region adapted to temperature monitor.

As illustrated in FIG. 21A, the second monitor circuit MON2T uses sub-threshold current Isub having large temperature dependency, but the leak current IL(QP21) of the PMOS transistor QP2 has offset current Iof which hardly depends on temperature. The offset current Iof is, for example, gate current, junction current, or the like. Therefore, in a low-temperature region (<temperature Tcrit), the relation between temperature and leak current is apart from exp(−Ea/kT) and precision cannot be obtained. The temperature Tcrit may be a decisive temperature (critical temperature) in which the sub-threshold current Isub is dominant or predetermined temperature.

In a modification, as illustrated in FIG. 21B, the absolute value of the second monitor circuit MON2T is corrected in a state where the activity (AC) of the semiconductor device 100 is relatively high. In FIG. 21B, the vertical axis indicates internal temperature (Ta) of the semiconductor device 100, the horizontal axis indicates operation power P (all power in predetermined operation of the semiconductor device including leak power) correlated to the activity (AC) of the semiconductor device 100, and line L100 indicates the relation between the internal temperature (Ta) of the semiconductor device 100 and the operation power P. As illustrated by the line L100, the operation power P correlated to the activity (AC) of the semiconductor device 100 and the increase amount from environment temperature (Tc) in the internal temperature of the semiconductor device 100 have a positive correlation. Consequently, it is preferable to obtain the correction information 13a of the absolute value of the second monitor circuit MON2T in a state (ACH) of the activity (AC) higher than the temperature Tcrit. The state higher than the temperature Tcrit can be checked by the first monitor circuit MON1a.

According to the embodiment, since the correction information of the absolute value of the second monitor circuit MON2 can be obtained correctly, there is an effect that the high-precision second monitor circuit MON2 can be obtained.

Another Use Example of Second Monitor Circuit

The second monitor circuit MON2 can be used also as an accumulated stress monitor circuit of monitoring a friction failure in the semiconductor device 100. For example, in the second monitor circuit MON2T illustrated in FIG. 7, the oscillation frequency Fout proportional to the PMOS transistor QP21 is generated. Off-leak current of the PMOS transistor QP21 is proportional to the exponent (exp (−Ea0/kT)) of the reciprocal of the temperature (Fout∝ exp(−Ea0/kT)). Ea0 denotes a coefficient peculiar to the off leak current. When Ea is a coefficient peculiar to a friction failure factor, the oscillation frequency Fout has the following relation.

(Oscillation frequency Fout of second monitor circuit MON2T)$^q$ ∝ exp(−Ea/kT)

where Ea=q*Ea0.

That is, by counting the oscillation frequency Fout of the second monitor circuit MON2T, a friction failure of the semiconductor device 100 can be predicted.

As described above, the second monitor circuit MON2 can be used also as an accumulated stress monitor circuit of determining the normal operation of the first monitor circuit MON1 and monitoring a friction failure of the semiconductor device 100, the area occupied in the semiconductor chip of the second monitor circuit MON2 does not become an overhead.

In addition, not only short-term operation assurance of the semiconductor device 100 using the first monitor circuit MON1 and the second monitor circuit MON2 but also long-term operation assurance of the semiconductor device 100 using the second monitor circuit MON2 as an accumulated stress monitor circuit of monitoring a friction failure of the semiconductor device 100 can be performed.

According to the embodiment, the following one or more effects can be obtained.

(1) The first monitor circuit MON1 and the second monitor circuit MON2 generate information of temperature or voltage on the basis of different principles. Consequently, also in the case where any of monitor circuits has a functional trouble which is overlooked at the time of designing of the semiconductor device 100 and at the time of shipment of the semiconductor device 100, occurrence of something abnormal can be notified to the user.

(2) By the effect (1), a high-reliable semiconductor device or a high-reliable semiconductor system can be provided.

(3) Since the first monitor circuit is adjusted at the time of designing and at the time of a pre-shipment test so that temperature or voltage can be monitored with high precision, monitoring of the temperature or voltage of the semiconductor device itself can be performed with high precision and, as a result, a high-reliable semiconductor device and a semiconductor system using the same are obtained.

(4) The output value (12b) of the second monitor circuit is configured to output the absolute value of temperature or voltage on the basis of the correction or calibration information (13a, 14a) obtained by the semiconductor device 100 by itself after shipment of the semiconductor device 100. Consequently, the area can be reduced by omitting an extra circuit related to increase the precision of the absolute value, and a pre-shipment test related to calibration of the absolute value can be omitted.

(5) By the effect (4), an effect that the second monitor circuit monitoring the normal operation of the first monitor circuit can be realized at low cost is produced.

(6) Also in the case where the semiconductor device 100 does not have an on-chip nonvolatile storage circuit, the off-chip nonvolatile storage circuit 14 provided for the semiconductor system can be used. Therefore, since calibration of the absolute value of the output value of the second monitor circuit can be performed on the basis of the correction or calibration information (13a, 14a) stored in the off-chip nonvolatile storage circuit 14, there is an effect that the precision of the second monitor circuit can be increased.

(7) Since the second monitor circuit MON2 can be also used as an accumulated stress monitor circuit of determining normal operation of the first monitor circuit MON1 and monitoring a friction failure of the semiconductor device 100, the area occupying in the semiconductor chip of the second monitor circuit MON2 does not become an overhead.

(8) Not only short-term operation assurance of the semiconductor device 100 using the first monitor circuit MON1 and the second monitor circuit MON2 but also long-term operation assurance of the semiconductor device 100 using the second monitor circuit MON2 as an accumulated stress monitor circuit of monitoring a friction failure of the semiconductor device 100 can be performed.

(9) By the effect (8), a more reliable semiconductor device or a more reliable semiconductor system can be provided.

Although the present invention achieved by the inventors herein has been concretely described above on the basis of the embodiments, obviously, the present invention is not limited to the foregoing embodiments and the examples but can be variously changed.

What is claimed is:

1. A semiconductor device comprising:
a first monitor circuit that monitors i) a first temperature of the semiconductor device using a first temperature sensor and ii) a first voltage of the semiconductor device using a first voltage sensor;
a second monitor circuit that monitors 1) a second temperature of the semiconductor device using a second temperature sensor and 2) a second voltage of the semiconductor device using a second voltage sensor; and
a correction circuit that 1) receives the first temperature and the first voltage from the first monitor circuit and the second temperature and the second voltage from the second monitor circuit, 2) generates correction information based on i) the received first temperature, ii) the received first voltage, iii) the received second temperature, and iv) the received second voltage, and 3) transmits the generated correction information to the second monitor circuit,
wherein, when the first temperature of the semiconductor device is higher than a threshold temperature, the second monitor circuit corrects, using the transmitted correction information, the second temperature and the second voltage, and
wherein the first monitor circuit has an area larger than that of the second monitor circuit.

2. The semiconductor device according to claim 1,
wherein the first temperature sensor detects the first temperature using a band gap temperature circuit, and
wherein the second temperature sensor detects the second temperature based on an oscillation frequency of a ring oscillator, the oscillation frequency being associated with leak current.

3. The semiconductor device according to claim 1,
wherein the first voltage sensor detects the first voltage, the first voltage sensor including an analog-to-digital conversion circuit that converts a reference potential to a digital signal so that the first voltage sensor processes information digitally, and
wherein the second voltage sensor detects the second voltage based on an oscillation frequency of a ring oscillator, the oscillation frequency being associated with the second voltage.

4. The semiconductor device according to claim 1, further comprising a nonvolatile storage device storing the correction information.

5. A semiconductor system comprising:
a semiconductor device; and
a nonvolatile storage device,
wherein the semiconductor device comprises:
a first monitor circuit generating first information according to a first temperature or a first voltage of the semiconductor device;
a second monitor circuit generating second information according to a second temperature or a second voltage of the semiconductor device;
a correction circuit 1) receiving the first information from the first monitor circuit and the second information from the second monitor circuit, 2) generating correction information based on the received first information and the received second information, 3) storing the generated correction information into the nonvolatile storage device, and 4) transmitting the generated correction information to the second monitor circuit, wherein the second monitor circuit corrects, using the transmitted correction information, the second information to generate third information that is the corrected second information; and
a check circuit 1) receiving the first information from the first monitor circuit and the third information from the second monitor circuit and 2) determining an abnormal operation of the first monitor circuit based on the first information and the third information.

6. The semiconductor system according to claim 5,
wherein the first monitor circuit detects the first temperature using a band gap temperature circuit, and
wherein the second monitor circuit detects the second temperature based on an oscillation frequency of a ring oscillator, the oscillation frequency being associated with leak current.

7. The semiconductor system according to claim 5,
wherein the first voltage sensor detects the first voltage, the first voltage sensor including an analog-to-digital conversion circuit that converts a reference potential to a digital signal so that the first voltage sensor processes information digitally, and
wherein the second voltage sensor detects the second voltage based on an oscillation frequency of a ring oscillator, the oscillation frequency being associated with the second voltage.

8. The semiconductor system according to claim 5, wherein an area of the first monitor circuit is larger than that of the second monitor circuit.

9. The semiconductor system according to claim 5, wherein the third information is stored in the nonvolatile storage device after the semiconductor device is mounted in the semiconductor system.

* * * * *